United States Patent
O'Neill et al.

(10) Patent No.: US 11,525,723 B2
(45) Date of Patent: Dec. 13, 2022

(54) DETERMINING FLUID PROPERTIES

(71) Applicant: Saudi Arabian Oil Company, Dhahran (SA)

(72) Inventors: Keelan Thomas O'Neill, Marmion (AU); Michael Leslie Johns, Canning Vale (AU); Einar Orn Fridjonsson, Lesmurdie (AU); Paul Louis Stanwix, Darlington (AU); Jana M. Al-Jindan, Dammam (SA); Mohamed Nabil Noui-Mehidi, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 17/007,405

(22) Filed: Aug. 31, 2020

(65) Prior Publication Data

US 2022/0065673 A1 Mar. 3, 2022

(51) Int. Cl.
*G01F 1/716* (2006.01)

(52) U.S. Cl.
CPC .................................. *G01F 1/716* (2013.01)

(58) Field of Classification Search
CPC . G01F 1/716; G01R 33/563; G01R 33/56308; G01R 33/56316; G01R 33/56509
See application file for complete search history.

(56) References Cited

U.S. PATENT DOCUMENTS

| 8,143,887 B2 | 3/2012 | Pusiol |
| 8,633,689 B2 | 1/2014 | Li et al. |

(Continued)

FOREIGN PATENT DOCUMENTS

| CN | 107703174 | 2/2018 |
| RU | 2427828 | 8/2011 |
| RU | 2544360 | 3/2015 |

OTHER PUBLICATIONS

O'Neill et al (Two-phase Oil/Water Flow Measurements using an Earth's Field Nuclear Magnetic Resonance Flow Meter, Chem. Eng. Sci., 202, 222-237, 2019, Applicant admitted prior art cited on IDS dated Dec. 1, 2020, Item 116 of the NPL listing.*

(Continued)

*Primary Examiner* — Jermele M Hollington
*Assistant Examiner* — Suresh K Rajaputra
(74) *Attorney, Agent, or Firm* — Fish & Richardson P.C.

(57) ABSTRACT

Techniques for measuring fluid properties include circulating a mixed-phase fluid flow through a fluid flow circuit; circulating the mixed-phase fluid flow through a pre-polarizing magnet; polarizing at least a gas phase of the mixed-phase fluid flow to an initial polarization; measuring fluid induction decay (FID) values of the polarized gas phase with the EFNMR detector; determining a velocity of the gas phase based on the FID values of the polarized gas phase; producing a pulsed magnetic field gradient to suppress one or more signals acquired by the EFNMR detector with a first electromagnet; measuring FID values of the liquid phase of the mixed-phase fluid with the EFNMR detector simultaneously with the production of the pulsed magnetic field gradient; producing a homogeneous polarizing field to polarize the liquid phase of the mixed-phase fluid with a second electromagnet; and determining a velocity and content of the liquid phase based on the FID values of the polarized liquid phase.

22 Claims, 15 Drawing Sheets

(56) References Cited

U.S. PATENT DOCUMENTS

| | | |
|---|---|---|
| 9,429,456 B2 | 8/2016 | Zoeteweij |
| 9,513,148 B2 | 12/2016 | Hogendoorn |
| 9,835,484 B2 | 12/2017 | Hogendoorn |
| 10,279,305 B2 | 5/2019 | May et al. |
| 10,393,559 B2 | 8/2019 | Hogendoorn |
| 2012/0055675 A1 | 3/2012 | Noui-Mehidi |
| 2012/0138308 A1 | 6/2012 | Noui-Mehidi |
| 2012/0211240 A1 | 8/2012 | Xiao et al. |
| 2013/0037275 A1 | 2/2013 | Noui-Mehidi et al. |
| 2013/0086994 A1 | 4/2013 | Noui-Mehidi et al. |
| 2013/0105174 A1 | 5/2013 | Noui-Mehidi et al. |
| 2013/0110411 A1 | 5/2013 | Black et al. |
| 2013/0146281 A1 | 6/2013 | Noui-Mehidi et al. |
| 2013/0151156 A1 | 6/2013 | Noui-Mehidi et al. |
| 2013/0259721 A1 | 10/2013 | Noui-Mehidi et al. |
| 2014/0028310 A1 | 1/2014 | Zoeteweij |
| 2014/0198617 A1 | 7/2014 | Noui-Mehidi et al. |
| 2014/0210634 A1 | 7/2014 | Black et al. |
| 2014/0246204 A1 | 9/2014 | Noui-Mehidi et al. |
| 2014/0246205 A1 | 9/2014 | Noui-Mehidi et al. |
| 2014/0333307 A1 | 11/2014 | Ahmad et al. |
| 2015/0027507 A1 | 1/2015 | Noui-Mehidi et al. |
| 2015/0027722 A1 | 1/2015 | Al-Mulhem et al. |
| 2015/0276445 A1 | 10/2015 | Black et al. |
| 2015/0276446 A1 | 10/2015 | Black et al. |
| 2015/0276447 A1 | 10/2015 | Black et al. |
| 2015/0279072 A1 | 10/2015 | Black et al. |
| 2015/0308869 A1 | 10/2015 | Black et al. |
| 2015/0377667 A1 | 12/2015 | Ahmad et al. |
| 2016/0076924 A1* | 3/2016 | Pusiol ............... G01F 1/74 324/306 |
| 2016/0102524 A1 | 4/2016 | Noui-Mehidi et al. |
| 2016/0202231 A1 | 7/2016 | Black et al. |
| 2016/0209542 A1 | 7/2016 | Black et al. |
| 2016/0245781 A1 | 8/2016 | Ahmad et al. |
| 2016/0335759 A1 | 11/2016 | Black et al. |
| 2016/0369623 A1 | 12/2016 | Ahmad et al. |
| 2016/0369624 A1 | 12/2016 | Ahmad et al. |
| 2016/0370489 A1 | 12/2016 | Arsalan et al. |
| 2017/0003359 A1 | 1/2017 | Rosen et al. |
| 2017/0009356 A1 | 1/2017 | Merzougui et al. |
| 2017/0010209 A1 | 1/2017 | Arsalan et al. |
| 2017/0317258 A1 | 11/2017 | Noui-Mehidi et al. |
| 2017/0363560 A1 | 12/2017 | Black et al. |
| 2017/0363580 A1 | 12/2017 | Ahmad et al. |
| 2018/0080893 A1 | 3/2018 | Black et al. |
| 2018/0143148 A1 | 5/2018 | May et al. |
| 2018/0156008 A1 | 6/2018 | Arsalan et al. |
| 2018/0156009 A1 | 6/2018 | Arsalan et al. |
| 2018/0156013 A1 | 6/2018 | Arsalan et al. |
| 2018/0156030 A1 | 6/2018 | Arsalan et al. |
| 2018/0230751 A1 | 8/2018 | Noui-Mehidi et al. |
| 2018/0238725 A1 | 8/2018 | Black et al. |
| 2018/0298750 A1 | 10/2018 | Ahmad et al. |
| 2018/0298751 A1 | 10/2018 | Ahmad et al. |
| 2018/0341037 A1 | 11/2018 | Arsalan et al. |
| 2018/0351480 A1 | 12/2018 | Ahmad et al. |
| 2018/0356356 A1 | 12/2018 | Black et al. |
| 2019/0003996 A1 | 1/2019 | Black et al. |
| 2019/0040683 A1 | 2/2019 | Noui-Mehidi |
| 2019/0040684 A1 | 2/2019 | Noui-Mehidi |
| 2019/0048685 A1 | 2/2019 | Batarseh et al. |
| 2019/0063216 A1 | 2/2019 | Bouldin et al. |
| 2019/0085687 A1 | 3/2019 | Noui-Mehidi et al. |
| 2019/0107590 A1 | 4/2019 | Fukushima et al. |
| 2019/0120791 A1 | 4/2019 | Al-Gouhi et al. |
| 2019/0154860 A1 | 5/2019 | Noui-Mehidi et al. |
| 2019/0154861 A1 | 5/2019 | Noui-Mehidi |
| 2019/0154862 A1 | 5/2019 | Noui-Mehidi |
| 2019/0178056 A1 | 6/2019 | Batarseh et al. |
| 2019/0226306 A1 | 7/2019 | Noui-Mehidi |
| 2019/0235121 A1 | 8/2019 | Arsalan et al. |
| 2019/0242251 A1 | 8/2019 | Ahmad et al. |
| 2019/0242252 A1 | 8/2019 | Ahmad et al. |
| 2019/0253003 A1 | 8/2019 | Ahmad et al. |
| 2019/0253004 A1 | 8/2019 | Ahmad et al. |
| 2019/0253005 A1 | 8/2019 | Ahmad et al. |
| 2019/0253006 A1 | 8/2019 | Ahmad et al. |
| 2019/0257156 A1 | 8/2019 | Batarseh et al. |
| 2019/0271576 A1 | 9/2019 | Ahmad et al. |
| 2019/0330924 A1 | 10/2019 | Noui-Mehidi |
| 2019/0331821 A1 | 10/2019 | Noui-Mehidi |
| 2019/0336924 A1 | 11/2019 | Noui-Mehidi |
| 2019/0360111 A1 | 11/2019 | Merzougui et al. |
| 2019/0376361 A1 | 12/2019 | Noui-Mehidi |
| 2020/0025719 A1 | 1/2020 | Ahmad et al. |
| 2020/0040696 A1 | 2/2020 | Arsalan et al. |
| 2020/0040697 A1 | 2/2020 | Arsalan et al. |
| 2020/0040698 A1 | 2/2020 | Arsalan et al. |
| 2020/0040699 A1 | 2/2020 | Arsalan et al. |
| 2020/0040700 A1 | 2/2020 | Arsalan et al. |
| 2020/0040701 A1 | 2/2020 | Arsalan et al. |
| 2020/0049634 A1 | 2/2020 | Aljindan et al. |
| 2020/0072016 A1 | 3/2020 | Al-Gouhi et al. |
| 2020/0088029 A1 | 3/2020 | Noui-Mehidi |
| 2020/0131883 A1 | 4/2020 | Arsalan et al. |
| 2020/0149395 A1 | 5/2020 | Bouldin et al. |
| 2020/0173822 A1 | 6/2020 | Noui-Mehidi |
| 2020/0256173 A1 | 8/2020 | Alruwaili et al. |
| 2020/0256174 A1 | 8/2020 | Alruwaili et al. |
| 2020/0256175 A1 | 8/2020 | Alruwaili et al. |
| 2022/0065672 A1* | 3/2022 | O'Neill ............... G01R 33/307 |

OTHER PUBLICATIONS

Blümich et al., "NMR at low magnetic fields," Chemical Physics Letters, 477, 231-240, 2009, 10 pages.

Conradi et al., "Pre-polarization fields for earth's field NMR: Fast discharge for use with short T1 and large coils," Journal of Magnetic Resonance, 281, 241-245, Aug. 2017, 6 pages.

Fridjonsson et al., "Earth's Field NMR Flow Meter: Preliminary Quantitative Measurements," Journal of Magnetic Resonance, vol. 245, 110-115, 2014, 6 pages.

Halse and Callaghan, "A dynamic nuclear polarization strategy for multi-dimensional Earth's field NMR spectroscopy," Journal of Magnetic Resonance, 195, 162-168, Sep. 2008, 7 pages.

Istratov and Vyvenko, "Exponential analysis in physical phenomena," Review of Scientific Instruments, 70, 1233-1257, 1999, 25 pages.

Leu et al., "Fixed and pulsed gradient diffusion methods in low-field core analysis," Magnetic Resonance Imaging, 23, 305-309, Feb. 2005, 5 pages.

Mitchell and Fordham, "Emulation of petroleum well-logging D—T2 correlations on a standard benchtop spectrometer," Journal of Magnetic Resonance, 212, 394-401, Oct. 2011, 8 pages.

Mitchell et al., "Low-field permanent magnets for industrial process and quality control," Progress in Nuclear Magnetic Resonance Spectroscopy, 76, 1-60, Jan. 2014, 270 pages.

Mitchell et al., "Numerical estimation of relaxation and diffusion distributions in two dimensions," Progress in Nuclear Magnetic Resonance Spectroscopy, 62, 34-50, 2012, 17 pages.

Mitchell et al., "Obtaining true transverse relaxation time distributions in high-field NMR measurements of saturated porous media: Removing the influence of internal gradients," Journal of Chemical Physics, 132, 244705, Jun. 2010, 11 pages.

Mohoric and Stepisnik, "NMR in the Earth's magnetic field," Progress in Nuclear Magnetic Resonance Spectroscopy, 54, 166-182, Apr. 2009, 18 pages.

O'Neill et al., "Quantitative multiphase flow characterisation using an Earth's field NMR flow meter," Flow Measurement and Instrumentation 58: 104-111, 2017, 8 pages.

O'Neill et al., "Quantitative velocity distributions via nuclear magnetic resonance flow metering," Journal of Magnetic Resonance 269: 179-185, 2016, 7 pages.

O'Neill et al., "Two-phase Oil/Water Flow Measurements using an Earth's Field Nuclear Magnetic Resonance Flow Meter," Chem. Eng. Sci., 202, 222-237, 2019, 16 pages.

Oliemans et al., "Core-annular oil/water flow: the turbulent-lubricating-film model and measurements in a 5 cm pipe loop," International Journal of Multiphase Flow, 13, 23-31, 1987, 9 pages.

(56) References Cited

OTHER PUBLICATIONS

Pendlebury et al., "Precision field averaging NMR magnetometer for low and high fields, using flowing water," Review of Scientific Instruments, 50, 535-540, May 1979, 6 pages.

Sukstanskii et al., "Theory of FID NMR Signal Dephasing Induced by Mesoscopic Magnetic Field Inhomogeneities in Biological Systems," Journal of Magnetic Resonance, 151, 107-117, Aug. 2001, 11 pages.

Xu et al., "Experimental investigation on the slip between oil and water in horizontal pipes," Experimental Thermal and Fluid Science, 33, 178-183, 2008, 6 pages.

Zargar et al., "Development of a Nuclear Magnetic Resonance Multiphase Meter: Report 1," for EXPECT Adv. Res. Ctr., Saudi Aramco, UWA Fluid Science and Resources Research Group, University of Western Australia, Oct. 31, 2019, 20 pages.

Zhen et al., "A resistive Q-switch for low-field NMR systems," Journal of Magnetic Resonance, 287, 33-40, 2018, 25 pages.

Appel et al., "SPE 141465 Robust Multi-Phase Flow Measurement Using Magnetic Resonance Technology" SPE Middle East Oil and Gas Show and Conference, Sep. 25-28, 2011, 20 pages.

O'Neill et al., "Development of an Earth's Field Nuclear Magnetic Resonance Multiphase Flow Meter," Nov. 2019, 212 pages.

PCT International Search Report and Written Opinion in International Appln. PCT/US2021/048428, dated Nov. 25, 2021, 18 pages.

PCT International Search Report and Written Opinion in International Appln. PCT/US2021/048481, dated Nov. 25, 2021, 15 pages.

\* cited by examiner

| Time Since Polarisation Switch on ($t_{PS}$) | Case | Description of Position | | | Fraction in Detection Zone | | | Visualisation of Effective Region Positions |
|---|---|---|---|---|---|---|---|---|
| | | Region | | | Region | | | |
| | | Initial | Interm. | Outside | Initial ($X_P$) | Interm. ($X_I$) | Outside ($X_O$) | |
| $0$ | A | Fully Inside | Outside | Outside | $1$ | $0$ | $0$ | Detection Region |
| $t_{PS} \leq \dfrac{L_I}{v}$ | B | Flush Out | Flush in | Outside | $\dfrac{L_D - vt_{PE}}{L_D}$ | $\dfrac{vt_{PE}}{L_D}$ | $0$ | Detection Region |
| $\dfrac{L_I}{v} < t_{PS} \leq \dfrac{L_D}{v}$ | C | Flush Out | Fully Inside | Flush in | $\dfrac{L_D - vt_{PE}}{L_D}$ | $\dfrac{L_I}{L_D}$ | $\dfrac{vt_{PE} - L_I}{L_D}$ | Detection Region |
| $\dfrac{L_D}{v} < t_{PS} \leq \dfrac{L_D + L_I}{v}$ | D | Outside | Flush Out | Flush in | $0$ | $\dfrac{L_D + L_I - vt_{PE}}{L_D}$ | $\dfrac{vt_{PE} - L_I}{L_D}$ | Detection Region |
| $t_{PS} < \dfrac{L_D + L_I}{v}$ | E | Outside | Outside | Fully Inside | $0$ | $0$ | $1$ | Detection Region |

FIG. 5

| Full Name | Abbreviation | Flow Regime Region on Map | Illustration | Photograph |
|---|---|---|---|---|
| Stratified Flow with Mixing at the Interface | St w/ mix | | | |
| Dispersion of Oil-in-water and Water | Do/w & w | | | |
| Oil-in-water Emulsion | Eo/w | | | |

FIG. 7

DETERMINING FLUID PROPERTIES

TECHNICAL FIELD

This disclosure relates to systems and methods for determining fluid properties and, more particularly, systems and methods for determining oil and water flow rates in a mixed-phase fluid flow regime.

BACKGROUND

The quantification of phase flowrates in an industrial multiphase pipeline may be of value in the petroleum and various other process industries. The development of reliable and accurate multiphase flow meters (MPFMs) has historically proven to be a significant challenge, for example, due to the complexity of industrial multiphase fluid streams. One difficulty in characterizing multiphase flows is the range of flow regimes possible, which describe the geometric arrangement of fluid phases in a pipeline (for example, stratified flow or emulsified flow). Each flow regime may have unique hydrodynamic characteristics such that the response of many multiphase flow measurement techniques is dependent on the flow regime. Furthermore, a greater range of field conditions is being observed in worldwide petroleum production (for example, as a result of increased water content as reservoir lifetimes are extended) such that new developments in MPFM are required to be accurate and robust across a range of flow conditions.

SUMMARY

In an example implementation, a fluid measurement system includes a fluid flow circuit that includes at least two liquid sources, a gas source, and a fluid mixer that mixes at least two liquids from the at least two liquid sources to form a liquid phase of a mixed-phase fluid that also includes a gas phase from the gas source; a pre-polarizing magnet positioned to receive the mixed-phase fluid flow from the fluid mixer; an Earth's field nuclear magnetic resonance (EFNMR) detector that includes a radio-frequency (RF) coil, a first electromagnet, and a second electromagnet, the EFNMR detector positioned to receive the mixed-phase fluid from the pre-polarizing magnet; and a control system communicably coupled to the pre-polarizing magnet and the EFNMR detector. The control system is configured to perform operations including controlling the pre-polarizing magnet to polarize at least the gas phase of the mixed-phase fluid flow to an initial polarization; controlling the EFNMR detector to measure a plurality of fluid induction decay (FID) values of the polarized gas phase; determining a velocity of the gas phase based on the plurality of FID values of the polarized gas phase; controlling the first electromagnet to produce a pulsed magnetic field gradient to suppress one or more signals acquired by the EFNMR detector; controlling the EFNMR detector simultaneously with the production of the pulsed magnetic field gradient to measure a plurality of FID values of the liquid phase of the mixed-phase fluid; controlling the second electromagnet to generate a homogeneous polarizing field to polarize the liquid phase of the mixed-phase fluid; determining a velocity of the liquid phase based on the plurality of FID values of the polarized liquid phase; and determining a content of the liquid phase based on the plurality of FID values of the mixed-phase fluid.

In an aspect combinable with the example implementation, the operation of determining a velocity of the gas phase based on the plurality of FID values of the polarized gas phase includes applying a pseudo-1D inversion to the plurality of FID values of the gas phase.

In another aspect combinable with any of the previous aspects, the operation of determining a velocity of the liquid phase based on the plurality of FID values of the polarized liquid phase includes applying another pseudo-1D inversion to the plurality of FID values of the liquid phase.

In another aspect combinable with any of the previous aspects, the operation of determining a content of the liquid phase based on the plurality of FID values of the mixed-phase fluid includes determining an oil-water content of the liquid phase with a 2D probability distribution of the velocity of the liquid phase in the mixed-phase fluid flow based on the applied another 1D inversion of the plurality of FID values of the liquid phase and a model kernel matrix.

In another aspect combinable with any of the previous aspects, at least one of the pseudo-1D inversion or the another pseudo-1D inversion includes a Tikhonov inversion.

In another aspect combinable with any of the previous aspects, the gas source includes a pressurized gas source fluidly coupled to the fluid flow circuit between the fluid mixer and the pre-polarizing permanent magnet.

In another aspect combinable with any of the previous aspects, the at least two liquids include oil and water.

In another aspect combinable with any of the previous aspects, the pre-polarizing magnet is positionable at a plurality of distances apart from the EFNMR detector.

In another aspect combinable with any of the previous aspects, the operation of controlling the EFNMR detector to measure the plurality of FID values of the polarized gas phase includes controlling the EFNMR detector to measure a first plurality of FID values of the polarized gas phase at a first distance of the plurality of distances; and controlling the EFNMR detector to measure a second plurality of FID values of the polarized gas phase at a second distance of the plurality of distances.

In another aspect combinable with any of the previous aspects, the operation of controlling the EFNMR detector to measure the plurality of FID values of the polarized liquid phase includes controlling the EFNMR detector to measure a first plurality of FID values of the polarized liquid phase at a first pulse time duration of a plurality of electromagnet pulse time durations; and controlling the EFNMR detector to measure a second plurality of FID values of the polarized liquid phase at a second pulse time duration of the plurality of electromagnet pulse time durations.

In another aspect combinable with any of the previous aspects, the plurality of FID values of the polarized gas phase include velocity values, and the plurality of FID values of the polarized liquid phase include velocity values and $T_1$ values of the liquid phase.

In another example implementation, a method for measuring fluid properties includes circulating a mixed-phase fluid flow through a fluid flow circuit that includes a gas source, at least two liquid sources, and a fluid mixer that mixes a liquid from each of the at least two liquid sources to form a liquid phase of the mixed-phase fluid flow that includes a gas phase; circulating the mixed-phase fluid flow through a pre-polarizing magnet; polarizing at least the gas phase of the mixed-phase fluid flow to an initial polarization with the pre-polarizing magnet; measuring a plurality of fluid induction decay (FID) values of the polarized gas phase with the EFNMR detector; determining a velocity of the gas phase based on the plurality of FID values of the polarized gas phase; producing a pulsed magnetic field gradient to suppress one or more signals acquired by the EFNMR detector with the first electromagnet; measuring a plurality of FID values of the liquid phase of the mixed-phase fluid with the EFNMR detector simultaneously with the production of the pulsed magnetic field gradient; producing a homogeneous polarizing field to polarize the liquid phase of the mixed-phase fluid with the second electromagnet; determining a velocity of the liquid phase based on the plurality of FID values of the polarized liquid phase; and determining a content of the liquid phase based on the plurality of FID values of the liquid phase of the mixed-phase fluid.

In an aspect combinable with the example implementation, determining a velocity of the gas phase based on the plurality of FID values of the polarized gas phase includes applying a pseudo-1D inversion to the plurality of FID values of the gas phase.

In another aspect combinable with any of the previous aspects, determining a velocity of the liquid phase based on the plurality of FID values of the liquid phase includes applying another pseudo-1D inversion to the plurality of FID values of the liquid phase.

In another aspect combinable with any of the previous aspects, determining a content of the liquid phase based on the plurality of FID values of the mixed-phase fluid includes determining an oil-water content of the liquid phase with a 2D probability distribution of the velocity of the liquid phase in the mixed-phase fluid flow based on the applied another 1D inversion of the plurality of FID values of the liquid phase and a model kernel matrix.

In another aspect combinable with any of the previous aspects, at least one of the pseudo-1D inversion or the another pseudo-1D inversion includes a Tikhonov inversion.

Another aspect combinable with any of the previous aspects further includes separating the liquid phase into a first liquid flow and a second liquid flow with a liquid separator fluidly coupled to a first liquid source and a second liquid source; and injecting the gas phase into the liquid phase from a pressurized gas source that is fluidly coupled in the fluid flow circuit between the fluid mixer and the pre-polarizing permanent magnet.

In another aspect combinable with any of the previous aspects, the first liquid includes oil and the second liquid includes water.

Another aspect combinable with any of the previous aspects further includes positioning the pre-polarizing magnet at a plurality of distances apart from the EFNMR detector.

In another aspect combinable with any of the previous aspects, measuring the plurality of FID values of the polarized gas phase with the EFNMR detector includes measuring a first plurality of FID values of the polarized gas phase with the EFNMR detector at a first distance of the plurality of distances; and measuring a second plurality of FID values of the polarized gas phase with the EFNMR detector at a second distance of the plurality of distances.

In another aspect combinable with any of the previous aspects, measuring the plurality of FID values of the polarized liquid phase with the EFNMR detector includes measuring a first plurality of FID values of the liquid phase with the EFNMR detector at a first pulse time duration of a plurality of pulse time durations of the second electromagnet; and measuring a second plurality of FID values of the liquid phase with the EFNMR detector at a second pulse time duration of a plurality of pulse time durations of the second electromagnet.

In another aspect combinable with any of the previous aspects, the plurality of FID values of the polarized gas phase include velocity values, and the plurality of FID values of the liquid phase include velocity values and $T_1$ values of the liquid phase.

Implementations of a fluid measurement system according to the present disclosure may include one or more of the following features. For example, a fluid measurement system may allow for unambiguous phase differentiation as opposed to conventional NMR multi-phase flow meters that do not produce probability distributions of velocity against the NMR spin-lattice relaxation parameter, $T_1$ (and thus composition). As another example, a fluid measurement system according to the present disclosure may utilize a moveable pre-polarizing magnet to allow for phase quantification based on an extent of polarization in the pre-polarization magnet and relaxation following the material leaving this magnetic field before entering an NMR detector. As another example, a fluid measurement system according to the present disclosure may be sensitive to a flow regime of a multi-phase fluid flowing through the system. As another example, a fluid measurement system according to the present disclosure may better measure phase volumetric flowrates as pertains to wet gas flow as compared to conventional NMR systems. For example, a fluid measurement system according to the present disclosure may enable detection of both the NMR liquid and gas signals and, in particular, a presence of a minimal amount of water and/or oil content. In addition, a fluid measurement system according to the present disclosure may utilize NMR signals of a liquid phase that are made discrete from the gas phase and amplified.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 5 shows a table that provides a description of position, quantification of the relevant fluid fractions, and a visual depiction of the regions within a detection zone of an Earth's field NMR detection coil according to the present disclosure.

FIG. 7 illustrates a table that shows a summary for relevant flow regimes of an oil-water fluid flowing through a fluid measurement system according to the present disclosure.

DETAILED DESCRIPTION

Figure 1:
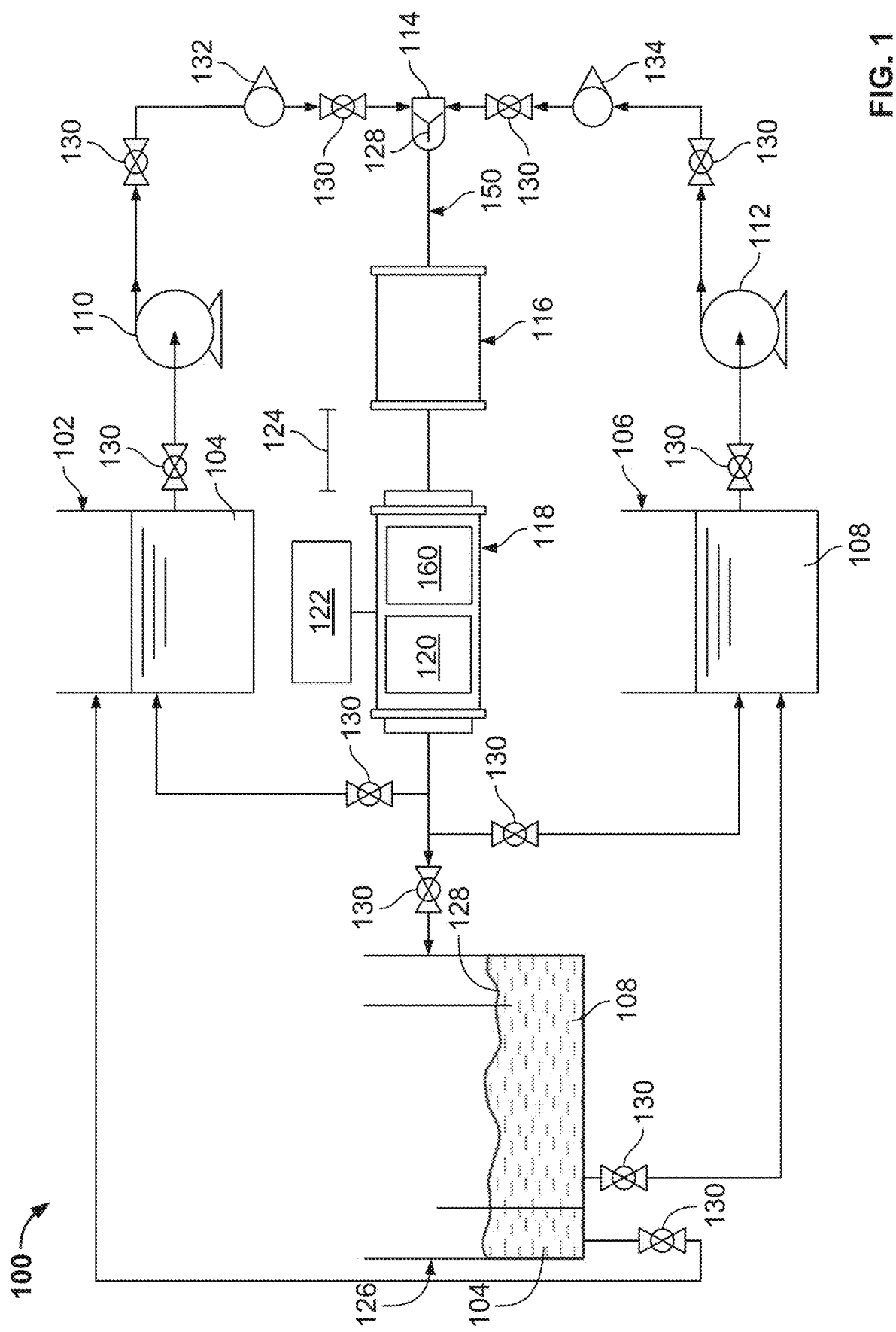
FIG. 1 is a schematic diagram of an example implementation of a fluid measurement system according to the present disclosure.

FIG. 1 is a schematic illustration of an example implementation of a fluid measurement system 100 according to the present disclosure. In some aspects, the fluid measurement system 100 provides for a simultaneous measurement of oil and water volumetric flowrates in a flowing fluid. In the example implementation of fluid measurement system 100, an Earth's field nuclear magnetic resonance (NMR) detection coil is applied to measure free induction decay (FID) signals of a two-phase oil/water flow. A dual polarization measurement assembly of the fluid measurement system 100 uses an upstream permanent magnet as well as an electromagnetic pre-polarizing coil. The FID signals with variable pre-polarizing conditions are acquired and fit with a model for the NMR fluid signal using an inversion technique (for example, a 2D Tikhonov regularization algorithm) to determine a joint 2D velocity-$T_1$ probability distribution. The measured velocity-$T_1$ distributions then provides for a calculation of individual phase flowrates in the oil-water fluid.

The utilization of the NMR detection coil may provide multiple measurement options in terms of quantifying the relevant phase fractions of a two-phase system (such as oil and water). The measurement of NMR signals is described by relaxation time constants ($T_1$ and $T_2$) associated with the fluids of interest, both of which quantify the rate of energy transfer in magnetic resonance processes. The spin-lattice relaxation rate ($T_1$) is a fluid property describing the rate of signal accumulation in a magnetic field, while the spin-spin relaxation rate ($T_2$) describes the rate of signal decay or dephasing of NMR-active atoms (for example, hydrogen as are used in this disclosure) within a fluid.

In contrast to $T_2$ relaxometry, analysis of $T_1$ relaxation may be a more robust and flexible mechanism to differentiate oil and water. $T_2$ measurements are achieved using multi-pulse acquisition sequences (e.g. CPMG measurements), however $T_1$ signal contrast can be achieved through variation of the pre-polarization conditions, $T_2$ measurements are more sensitive to internal magnetic field gradients arising from susceptibility differences between phases in emulsified flows. In some aspects, $T_1$ measurements may be a more robust approach for fluid relaxometry characterization.

Several inversion techniques may be available to determine a joint 2D velocity-$T_1$ probability distribution. In an example implementation of fluid measurement system 100, the oil-water flow may be quantitatively characterized using a 2D velocity-$T_1$ distributions extracted from measured NMR signal data using Tikhonov regularization. In some aspects, Tikhonov regularization is a robust mathematical inversion technique, useful in determining relevant distributions of parameters. For example, regularization may be effective at handling noisy signal data and may not require any assumptions regarding the shape of the resultant probability distribution.

Generally, the example inversion technique used in fluid measurement system 100 includes a discretized probability distribution vector of a variable (p), which may be expressed as a function of an experimentally acquired NMR signal (s) via a model kernel matrix (M) with the generalized linear inverse problem:

$$s = Mp \tag{1}$$

Regularization may provide a method of determining a realistic probability distribution, p, from Eq. (1). A stable inversion in the presence of experimental noise may be achieved by applying a penalty function. In Tikhonov regularization, the following expression is minimized in order to determine p:

$$\min\{\|Mp-s\|^2 + \alpha\|Qp\|^2\}, \tag{2}$$

where $\alpha$ is a smoothing parameter and Q is a smoothing operation matrix. In this example, Q is designed to calculate the finite second derivative of the resultant probability distribution to ensure smoothness. The first term in Eq. (2), $\|Mp-s\|^2$, is the residual norm while the second term, $\|Qp\|^2$, is a penalty function. The smoothing parameter is used to optimize the compromise between finding the true solution (minimizing the residual norm) and limiting the impact of noise on the solution (minimizing the penalty function). In this example, the value of $\alpha$ is selected using a generalized cross-validation (GCV) method, which has been widely validated for NMR data interpretation. This method sequentially removes a data point in the solution (s) and determines the value of the smoothing parameter which predicts the removed point with the best accuracy. This may be repeated for each data point in s, and a GCV score is determined as a function of $\alpha$. The value of $\alpha$ that minimizes this GCV score is the optimal smoothing parameter.

Two-dimensional NMR measurements may be useful in probing local surroundings as well as providing chemical information for complex systems. Such systems can be characterized by distributions of measured parameters (e.g., $T_1$, $T_2$ or self-diffusion coefficients (D)); therefore appropriate data analysis methods may be required to provide reliable interpretation of results. Tikhonov regularization is extrapolated to such 2D data in this example, and is used in the example implementation to produce 2D probability distributions of $T_1$ and velocity for the multiphase oil-water flow.

The example implementation of the fluid measurement system 100 shown in FIG. 1 includes the following components. An oil tank 102 holds oil 104 and is fluidly coupled to an oil pump 110 that is in turn fluidly coupled to a fluid mixer 114. A water tank 106 holds water 108 and is fluidly coupled to a water pump 112 that is in turn fluidly coupled to the fluid mixer 114. As shown in FIG. 1, lines that connect such components represent a conduit 150 or connected portions of conduit 150 through which the oil 104, the water 108, and an oil-water fluid 128 is circulated by the pumps 110 and 112. A pre-polarizing permanent magnet 116 is positioned around or adjacent to the conduit downstream of the fluid mixer 114 to receive the oil-water fluid 128. Positioned a variable distance 124 downstream from the pre-polarizing permanent magnet 116 is an EFNMR detector 118 that includes an electromagnet 160 and a radio-frequency coil 120. A control system 122, shown communicably coupled to the EFNMR detector 118, is operable to control the operation of and receive measurements from the EFNRM detector 118. The control system 122 may also be communicably coupled (wirelessly or wired) to one or more of the referenced components of fluid measurement system 100 to control the operation of, and receive data (such as measurements) from, such components.

An oil-water separator 126 is positioned downstream of the EFNMR detector 118 to receive the oil-water fluid 128 and separate the oil-water fluid 128 back into the constituents of oil 104 and water 108. Such constituents are circulated back to their respective tanks 102 and 106. As shown in the example implementation of fluid measurement system 100, valves 130 are positioned in the conduit to shut-off or modulate (or both) a flow of the oil 104, the water 108, or the oil-water fluid 128. As further shown, an oil flow meter 132 is positioned between the oil pump 110 and the fluid mixer 114. A water flow meter 134 is positioned between the water pump 112 and the fluid mixer 114. Both flow meters 132 and 134 may measure a flow rate of their respective constituents and, in some aspects, provide such flow rate values to the control system 122.

In this example, the pre-polarizing permanent magnet 116 is a 0.3 T Halbach array located the variable distance 124 ($L_{PD}$) upstream of the EFNMR detector 118. In some aspects, the Halbach array can be shifted such that the polarization detection separation distance 124 is between 45 and 200 cm. In some aspects, shorter distances are not achievable due to the stray field from the Halbach array interfering with the EFNMR detector 118 and larger distances are impractical for a realistic flow metering system construction.

The combination of the EFNMR detector 118 and radio-frequency coil 120 may be used to excite and detect an NMR signal (for example, at about 2.29 kHz, the $^1$H Larmor frequency at the local Earth's magnetic field). The radio-frequency coil 120 may include a coaxial solenoid of diameter 10 cm, operating at 6 A to produce an 18.7 mT magnetic field, which can be used to provide a polarization field to generate magnetization at the EFNMR detector 118. The illustrated combined polarization scheme (simultaneously using the pre-polarizing magnet 116 and the electromagnet 160 of the EFNMR detector 118) is discussed later. The EFNMR detector 118, in some aspects, includes an external resistive Q-switch, which enables the acquisition delay time to be reduced from 25 ms to 9 ms, allowing earlier acquisition of free induction decay (FID) signals.

As shown, oil 104 and water 108 are stored separately in oil tank 102 and water tank 106, respectively. Pump 110 may be a close-coupled centrifugal pump (for example, Calpeda NM32-20A). Flow meter 132 includes an in-line rotameter (for example, Stubbe DFM350, 2.5-25 m$^3$/h). In some aspects, such as to mirror a composition of subterranean water, as well as to reduce a separation time of oil-in-water emulsions during operation of the fluid measurement system 100, the water 108 may be concentrated with sodium chloride (for example, 12 wt %). The addition of salt causes an increase in the water density and viscosity. Pump 112 may be a centrifugal pump (for example, Calpeda MXFILM803). Flow meter 134 includes an in-line rotameter (for example, Stubbe DFM350).

In some aspects, both flow meters 132 and 134 are calibrated using gravimetric measurement of fluid outflow in order to account for the used fluid viscosities and densities. The individual fluid flowrates can be varied using associated valves 130. The oil-water separator 126 may be a gravimetric oil/water separator (separation volume of 128 L) in order to split the oil 104 and the water 108 before returning to their individual storage tanks 102 and 106, respectively.

The example implementation of flow measurement system 100 may use a model for the NMR signal acquired by the EFNMR detector 118 for fluid moving through the flow metering section. In some aspects, the measured NMR signal is a composite of three contributions: development of signal magnetization during polarization ($S_P$), signal attenuation from intermediate decay between the polarization magnet and the EFNMR detector 118 ($S_{PD}$), and signal attenuation following excitation ($S_D$). In some aspects, during the development of the NMR signal model for the fluid measurement system 100, the fluid is considered to be discretized into separate fluid elements. When an individual fluid element is moving through a particular one of the flow meters 132 or 134 with a velocity, v, the signal contribution of this fluid element to the overall FID signal acquired at the EFNMR detector 118 is given in Eq. 3 by:

$$S(t_e, v) = S_{OH}(1-e^{L_P/vT1})(e^{-L_{PD}/vt1})(1-{}^{t_ev}/_{L_D})$$
$$e^{-t_e/T_2^*} \quad t_e \leq L_D/v$$

where $t_e$ is the time since a radio-frequency excitation pulse by the radio-frequency coil 120, $S_{OH}$ is the NMR signal after an infinite time in the magnetic field of the pre-polarizing permanent magnet 116, $L_P$ is the length of the pre-polarizing permanent magnet 116, $L_{PD}$ is the polarization detection separation distance 124, $L_D$ is the length of the radio-frequency coil 120, $T_1$ is the spin-lattice relaxation time, and $T^*_2$ is the effective spin-spin relaxation time.

The example implementation of the fluid measurement system 100 uses $T_1$ differentiation in order to quantify the oil 104 and the water 108 in the oil-water fluid 128. In order to obtain an indication of the spin-lattice relaxation rates expected under flow, $T_1$ measurements of the stationary fluids (the water 108 and the oil 104) can be performed (using standard NMR measurement techniques) to determine log-mean $T_1$ values ($T_1$, LM) for the oil 104 and the water 108. The fast spin-lattice relaxation of the oil 104 may introduce difficulty in terms of obtaining a measurement with a reasonable signal-to-noise-ratio (SNR) for the oil 104. The signal attenuation during intermediate decay (SPD) is anticipated to be significant for the oil 104 due to its low $T_1$ (relative to the water 108), particularly at low velocities (for example, <1.0 m/s). Measurements of the SNR (calculated as the ratio of the initial FID signal (at $t=t_{delay}=9$ ms) to standard deviation of the measured noise) may be obtained with only the oil 104 flowing through the fluid measurement system 100 at velocities of 0.17-1.83 m/s. In some aspects, FID measurements are obtained using scan averages ($N_{scans}=32$) at a separation distance 124 of 45 cm.

The radio-frequency coil 120 and accompanying electromagnet 160 that is incorporated with the EFNMR detector 118 (and used for stationary fluid measurements) was previously considered unsuitable for flowing measurements with water, as the outflow effect does not allow sufficient time for polarization and detection to occur within the radio-frequency coil 120. However, the application of the radio-frequency coil 120 and accompanying electromagnet 160 can be considered useful for fluids with low $T_1$ at low velocity. FID measurements of the oil 104 can be obtained using only the radio-frequency coil 120 (without the pre-polarizing permanent magnet 116) and the accompanying electromagnet 160, which is applied for a pre-polarizing time of 600 ms. Thus, the combination of the two polarizing mechanisms (the pre-polarizing permanent magnet 116 and the electromagnet 160) may be effective at different oil velocity ranges.

In some aspects, the pre-polarizing permanent magnet 116 may provide a much stronger signal across a broad range of velocities compared to the electromagnet 160. However, the electromagnet 160 may be able to fill a void for low velocity (<1.0 m/s) and low $T_1$ (50-600 ms) fluids (such as the oil 104) where the pre-polarizing permanent magnet 116 may have a poor SNR due to intermediate signal decay between polarization and detection. By combining the polarizing methods in a dual polarization mechanism, the flow metering system 100 may measure signals across a range of velocities (0-3 m/s) and fluid $T_1$ values (50 ms-10 s). In some aspects, such combined measurements may always incorporate the pre-polarizing permanent magnet 116, with the option of additional re-polarization using the electromagnet 160 once the oil-water fluid 128 reaches the EFNMR detector 118.

In some aspects, measurement of the fluid $T_1$ under flow may utilize an independent variable to observe signal contrast according to $T_1$. For measurements obtained using the pre-polarizing permanent magnet 116 alone, an example independent variable is the separation distance 124, which can easily be adjusted via movement of the pre-polarizing permanent magnet 116. Signal contrast due to the electromagnet 160, however, can be observed by varying the pre-polarization time ($t_{polz}$). Thus variable separation distances (45-150 cm) may be used to measure signal contrast for fluids with higher $T_1$ (and/or at high velocities), while the variable pre-polarization time (10-600 ms) may be used to measure signal contrast for low $T_1$ fluids with low velocity.

In some aspects of the fluid measurement system 100, the secondary polarization mechanism) may be incorporated into the NMR model. In some aspects, the introduction of the dual polarization mechanism involves the application of the electromagnet 160 in some of the FID measurements to provide additional re-polarization, while the pre-polarizing permanent magnet 116 is applied as it is fixed around the conduit in which the oil-water fluid 128 circulates. For aspects where the electromagnet 160 is not applied (in other words, the pre-polarizing permanent magnet 116 alone is used for pre-polarization), the effective signal polarization due to the pre-polarizing permanent magnet 116 just prior to excitation ($S_{PH}$), including the intermediate signal decay term, can be considered as:

$$S_{PH}(L_{PD}, v, T_1) = S_{OH}\left(1 - \exp\left(-\frac{L_{PH}}{vT_1}\right)\right)\exp\left(-\frac{L_{PD}}{vT_1}\right), \quad (4)$$

where $S_{OH}$ is the overall signal magnetization after an infinite time in the field generated by the pre-polarizing permanent magnet 116 and $L_{PH}$ is the effective length of the pre-polarizing permanent magnet 116. A fraction of the oil-water fluid 128 which is not polarized ($x_{NP}$) upon reaching the EFNMR detector 118 can be considered as:

$$X_{NP} = 1 - \frac{S_{PH}}{S_{OH}} \quad (5)$$

Equation (5) represents oil-water fluid 128 which was either not polarized at the pre-polarizing permanent magnet 116 or has decayed to its original energy state during the residence time between pre-polarization and detection (for example, by EFNMR detector 118). The effective signal polarization of a stationary fluid due to the electromagnet 160 can be described by the $T_1$ signal development:

$$S_{PC}(t_{polz}, T_1) = S_{OC}\left(1 - \exp\left(-\frac{t_{polz}}{T_1}\right)\right)\exp\left(-\frac{t_{PE}}{T_1}\right) \quad (6)$$

where $S_{OC}$ is overall signal magnetization after an infinite time in the field of the radio-frequency coil 120, $t_{polz}$ is the polarization time, and $t_{PE}$ is the polarization-excitation delay (for example, 60 ms). In some aspects, a limit may be imposed on the polarization time for measurements conducted on the flowing oil-water fluid 128; the effective polarization time may be limited by the fluid residence time in the radio-frequency coil 120. A fluid element traveling with velocity, v, will leave the radio-frequency coil 120 (for example, with an effective length $L_{PC}$ of 27 cm) after a residence time $\tau_{PC}=L_{PC}/v$. Thus, Equation (6) can be updated for a flowing fluid:

$$S_{PC}(t_{polz}, T_1) = S_{OC}\left(1 - \exp\left(-\frac{\tau_{PC}}{T_1}\right)\right)\exp\left(-\frac{t_{PE}}{T_1}\right), \quad (6)$$

where $$\tau_{PC} = \min\left(t_{polz}, \frac{L_{PC}}{v} - t_{PE}\right) \quad (7)$$

In this example, the polarization-excitation delay term ($t_{PE}$) is included to account for fluid which would leave the radio-frequency coil 120 during the delay time. The incorporation of the minimization term may effectively restrict a range of useful polarization times according to the velocity of the oil-water fluid 128; larger pre-polarization times ($t_{polz}$>600 ms) may be ineffective as the fluid will flush through the radio-frequency coil 120 before sufficient polarization can be achieved. When combining the dual effects of the pre-polarizing permanent magnet 116 and the radio-frequency coil 120, oil-water fluid 128 that is not polarized upon reaching the EFNMR detector 118 (quantified by Eq. (5)) can be re-polarized by the radio-frequency coil 120. Therefore, the combined signal polarization ($S_P$) is modelled by:

$$S_P = S_{PH} + \left(1 - \frac{S_{PH}}{S_{O,H}}\right) * S_{PC} \quad (8)$$

If the radio-frequency coil 120 is not applied (in other words, $\tau_{PC}=t_{polz}=0$) then $S_P=S_{PH}$, meaning that the overall signal polarization is just the signal polarization due to the pre-polarizing permanent magnet 116. The overall model for the NMR signal of a the oil-water fluid 128 can be considered as:

$$S(L_{PD}, t_{polz}, t_e, v, T_{1,EF}) = S_P\left(1 - \frac{t_e v}{L_D}\right)e^{-\frac{t_e}{T_2}} \text{ for } t_e \leq \frac{L_D}{v} \quad (9)$$

where $S_P$ is defined in Eq. (8).

The example implementation of flow metering system 100 may apply multiple NMR "pulse and collect" sequences in order to acquire FID measurements. In the case where the dual polarization scheme is utilized, the polarization pulse is applied for a polarization time, $t_{polz}$, followed by a 90 degrees radio frequency pulse by the radio-frequency coil 120 to excite the oil-water fluid 128. Then, the FID is detected in the EFNMR detector 118 by the same radio-frequency coil 120.

Figure 3:
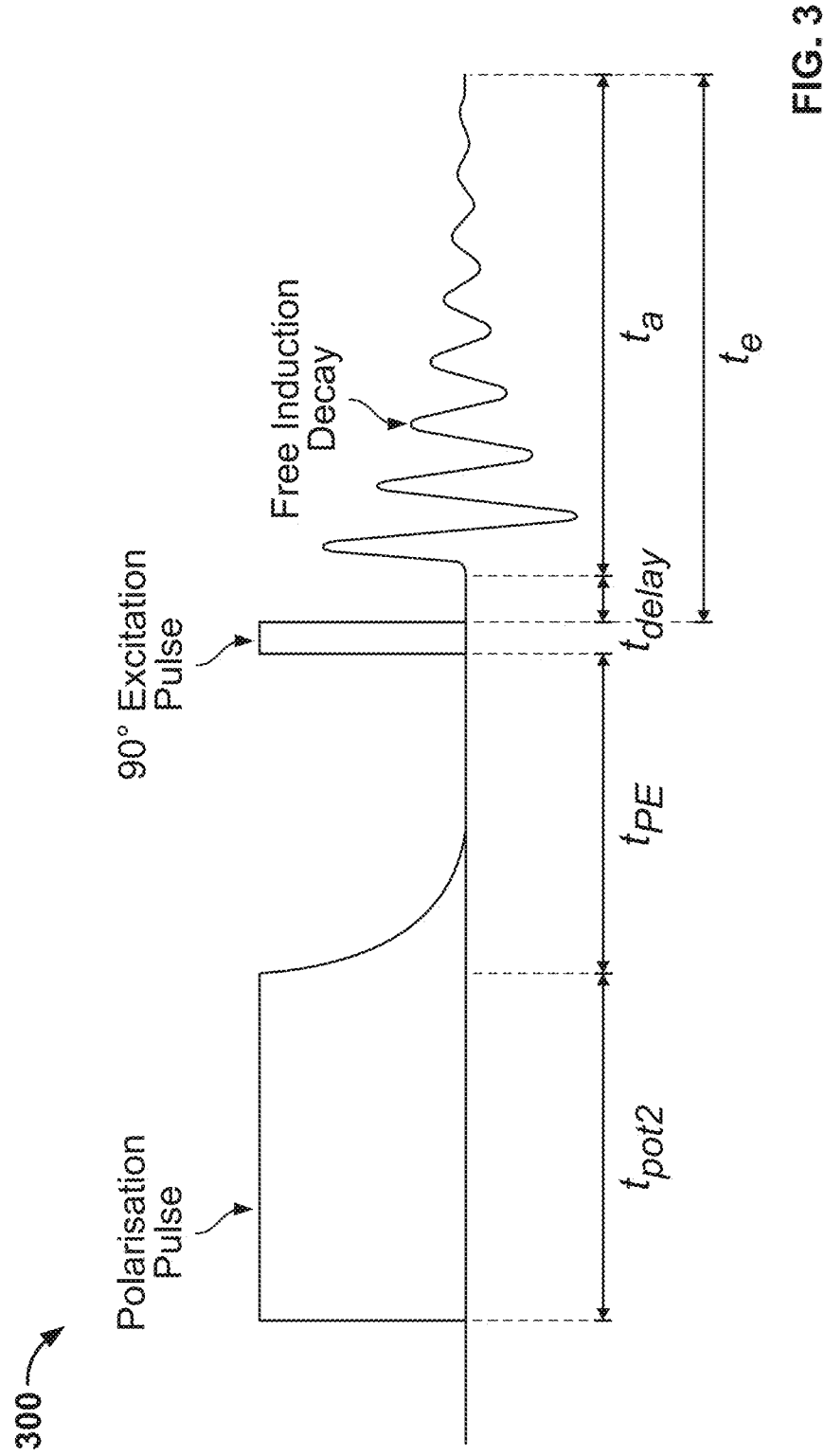
FIG. 3 illustrates an example pulse and collect sequence diagram according to the present disclosure.

An example "pulse and collect" sequence diagram is shown in FIG. 3, which illustrates a sequence diagram 300. The sequence diagram 300 shows illustrative definitions of timing parameters, including: the length of the polarization pulse ($t_{polz}$), the delay between polarization and excitation ($t_{PE}$), the acquisition delay ($t_{delay}$) and the acquisition time ($t_a$). The time since excitation ($t_e$) is the combination of the acquisition delay and acquisition time (for example, $t_e = t d_{elay} + t_a$). The use of the pulse and collect measurement implies that the measured FID signal incorporates spin-spin relaxation ($T_2$) as well as decay due to magnetic field inhomogeneity in the Earth's field ($T_2$, I). These effects may be combined into an effective spin-spin relaxation ($T^*_2$) with the assumption that the magnetic field inhomogeneity causes exponential signal decay behavior. However, the signal decay due to field inhomogeneity can often be non-exponential; therefore assuming an exponential decay can result in significant error during signal analysis. Experimental FID measurements using the EFNMR detector 118 have previously been observed to produce a half-Gaussian line shape. The field inhomogeneity signal decay (I) can be described by the following half-Gaussian model:

$$I(t_e) = \exp(-R_I t_e^2) \quad (10)$$

where $t_e$ is the time since excitation and $R_I$ is a Gaussian relaxation rate constant accounting for the rate of signal decay introduced by magnetic field inhomogeneity. A FID signal ($S_{FID}$), which incorporates half-Gaussian decay behavior can be described by the following model equation:

$$S_{FID}(t_e) = S_E e^{1/2} I(t_e) \quad (11)$$

where $S_E$ is the polarized signal prior to excitation and $T_2$ is the spin-spin relaxation constant for a given fluid. The field inhomogeneity signal decay ($I(t_e)$) can effectively be calibrated via measurement of the CPMG decay signal ($S_{CPMG}$) as well as a standard pulse and collect FID measurement of stationary water ($S_{FID}$). The field inhomogeneity decay is determined using:

$$I(t_e) = \frac{S_{FID}}{S_{CPMG}} \quad (12)$$

In some aspects, the movement of the pre-polarizing permanent magnet 116 is observed to interfere with the Earth's field homogeneity and therefore the inhomogeneity decay function must be measured at each relevant separation distance 124. The model for NMR signal of a flowing fluid (Eq. (9)) is updated in consideration of the observed FID behavior:

$$S(L_{PD}, t_{polz}, t_e, v, T_1) = S_p\left(1 - \frac{t_e v}{L_D}\right) I(t_e, L_{PD}) e^{-\frac{t_e}{T_2}} \text{ for } t_e \leq \frac{L_D}{v} \quad (13)$$

where $I(t_e, L_{PD})$ is the measured field inhomogeneity distribution at a given separation distance 124 ($L_{PD}$). The final FID component to be considered for flow measurements is the $T_2$ signal decay of the oil-water fluid 128 under flow. The measured $T_2$ relaxation during circulation of the oil-water 128 may be a function of the fluid phase composition considering the differing $T_2$ relaxation rates for the oil 104 and the water 108. The simultaneous measurement of fluid $T_2$ distribution with velocity and $T_1$ under flow may be difficult; therefore a $T_1/T_2$ ratio is introduced in order to link the modelled $T_2$ decay to the measured $T_1$ decay. The $T_1/T_2$ ratio is defined as $R_T = T_1/T_2$ and is specified about the oil/water $T_1$ cutoff of $T_{1,C} = 0.60$ s; with oil ($T_1 < 0.60$) having $R_T = 1.35$ and water ($T_1$ 0.60 s) using $R_T = 1.63$ (determined from stationary fluid relaxation measurements). The $T_1/T_2$ ratio is introduced into the model for NMR signal of a flowing fluid:

$$S(L_{PD}, t_{polz}, t_e, v, T_1) = S_p\left(1 - \frac{t_e v}{L_D}\right) I(t_e, L_{PD}) e^{t_e R_T/T_1} \text{ for } t_e \leq \frac{L_D}{v} \quad (14)$$

This effectively removes $T_2$ from the model equation, leaving velocity (v) and spin-lattice relaxation in the Earth's field ($T_1$) as the only dependent variables. The incorporation of the $T_1/T_2$ ratio assumes that the ratio is constant as a function of $T_1$. This assumption is reasonable; the fluid $T_1/T_2$ ratio should only change in the presence of diffusive decay (which influences $T_2$ but not $T_1$). Diffusional decay will occur for, for example, emulsified flows (where droplets are present) however for such flows at higher velocities ($_v > 1.0$ m/s) $T_2$ relaxation becomes much less important as the FID is increasingly dominated by the flush-out effect.

Regarding the flush-out effect, the oil-water fluid 128, as previously described, may be subjected to a dual-polarization scheme. As described, the scheme enables the polarization of the NMR signal from the pre-polarizing permanent magnet 116 (of variable position) to be combined with the polarization of the NMR signal from the electromagnet 160 (which was applied for a variable time). The transition of polarized magnetization from the pre-polarizing permanent magnet 116 into the field of the pre-polarizing field of the electromagnet 160 may include consideration of the operation of the EFNMR detector 118.

For example, the EFNMR detector 118 utilizes the electromagnet 160 in order to achieve reasonable signal sensitivity due to the increased polarizing field strength (~18.7 mT compared to the Earth's Field strength of ~54 µT). In using the pre-polarizing field, it may be necessary to ensure that the full pre-polarized magnetization can be detected by allowing an adiabatic field discharge. The field discharge from the polarizing field strength to Earth's field strength may be sufficiently slow to ensure an adiabatic field transition. The non-adiabatic transition occurring for the polarization coil "switch on" may be important for the particular EFNMR detector 118 with a dual polarization scheme.

For example, the oil-water fluid 128 entering the EFNMR detector 118 will have previously been magnetized or polarized by the upstream pre-polarizing permanent magnet 116 and therefore possess an initial magnetization. The rate of polarizing field accumulation may be too fast (for example, the time for field "switch-on" is too short) and therefore the flowing oil-water fluid 128 experiences a non-adiabatic transition from Earth's field to polarizing field. In some aspects, this means that the pre-magnetized signal (due to the pre-polarizing permanent magnet 116) may not be able to fully re-orientate from the Earth's field to the pre-polarizing field. Consequently, a signal loss may be observable between a single-polarizing scheme (in other words, where only the pre-polarizing permanent magnet 116 is used) and a dual-polarizing scheme (in other words, where the pre-polarizing permanent magnet 116 and the electromagnet 160 are used simultaneously).

Figure 4:
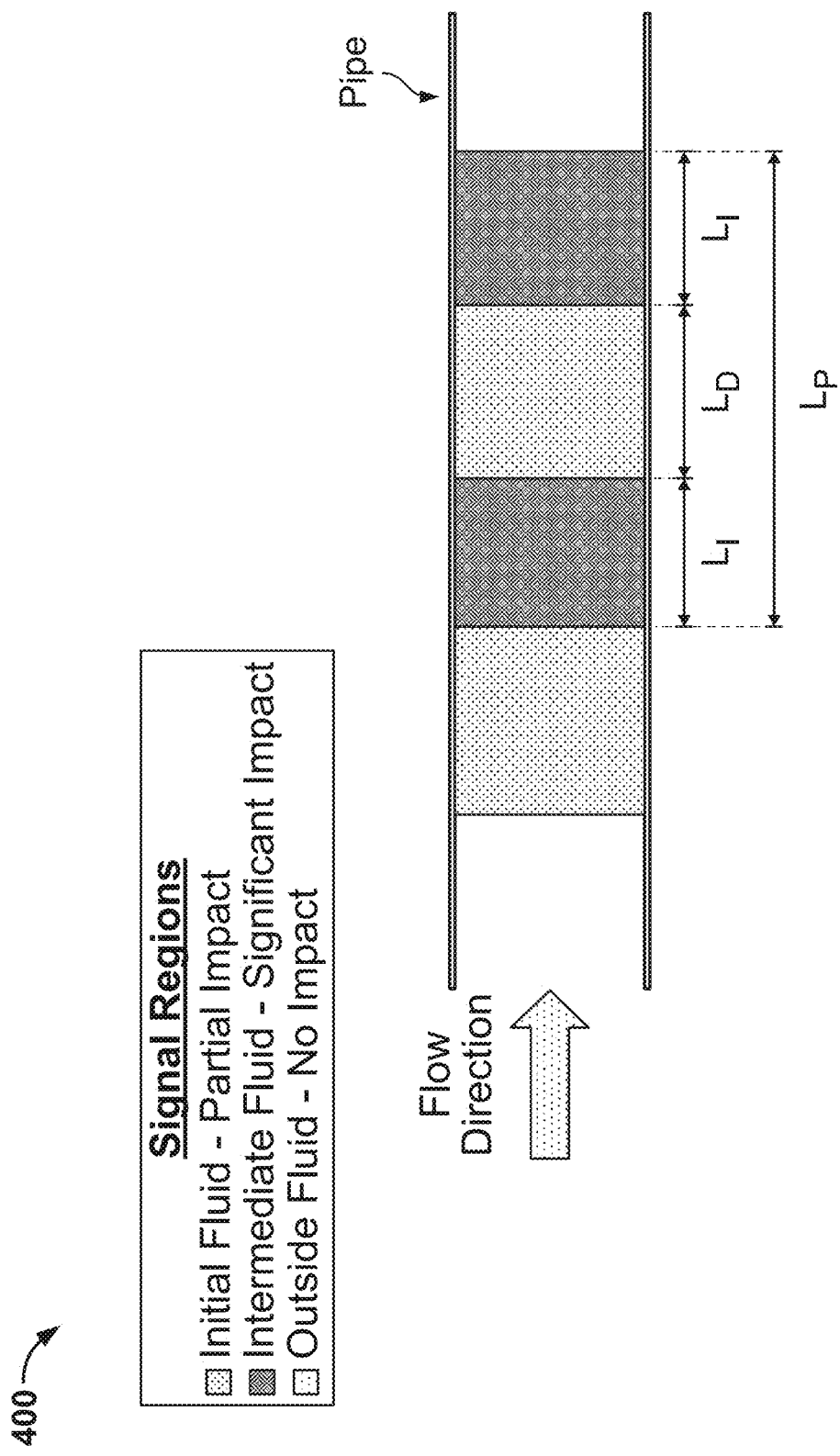
FIG. 4 illustrates a schematic diagram of a conduit through which an oil-water fluid flows as it enters a detection region of an Earth's field nuclear magnetic resonance (NMR) detection coil according to the present disclosure.

The impact of the non-adiabatic field change on the measured signals is incorporated into the NMR model. For example, the oil-water fluid 128 within the conduit (or pipeline) is separated into regions of significance based on the fluid position relative to the polarization and detection zones of the EFNMR detector 118. These regions are illustrated in FIG. 4 and a description of the signal attenuation for each region is provided below the figure. As shown, FIG. 4 illustrates a schematic diagram 400 of a conduit through which the oil-water fluid 128 flows as it enters a detection region of the EFNMR detector 118.

FIG. 4 illustrates three regions of fluid within the pipeline; the initial fluid, intermediate fluid and outside fluid. The "initial fluid" region is fluid in the detection region of the EFNMR detector 118 when the electromagnet 160 is switched on. The detection zone (for example, of length $L_D=10$ cm) reflects the sensitivity of the EFNMR detector 118 along the axis parallel to the pipeline. The majority of the fluid in the detection region will experience an adiabatic transition as the signal sensitivity is strongest towards the center of the radio-frequency coil 120. However, a full adiabatic transition between fields may not be possible due to the time of coil switch-on; thus a small fraction of the polarized fluid ($k_P$) will not transition from Earth's field to the pre-polarizing field resulting in signal loss.

The "intermediate fluid" region is fluid outside the detection zone of the EFNMR detector 118 but still within the polarization zone (for example, of length $L_P=27$ cm) of the radio-frequency coil 120. This portion of oil-water fluid 128 is in two regions either side of the detection zone (for example, both of length $L_I=8.5$ cm). This region has significantly poorer sensitivity relative to the detection zone. The impact of the non-adiabatic transition may result in a more significant fraction of fluid ($k_I$) experiencing a non-adiabatic transition.

The "outside fluid" region may not be impacted by the non-adiabatic transition as this portion of the oil-water fluid 128 is not within the polarizing region of the electromagnet 160. It may be assumed that this portion, which moves from outside the polarizing region to within the polarizing region, may effectively experience an adiabatic transition. For example, the electromagnet 160 will have a "polarization profile" involving changing field strength with length. The velocity of the oil-water fluid 128 may be low enough such that the fluid will experience a gradual change in field strength as it moves into the polarizing region. There may be no signal change of the outside fluid initially, however this outside fluid becomes important as it moves into the detection zone replacing fluid which has experienced a signal change.

The effect of the non-adiabatic transition may depend on the type of fluid (in other words, initial, intermediate or outside) and the relative fraction of each fluid in the EFNMR detector 118 at a given time. In order to aid the understanding of the signal loss model, FIG. 5 shows a table 500 that provides a description of position, quantification of the relevant fluid fractions, and a visual depiction of the regions within the detection zone for five different cases at different times since the polarization switch on.

Table 500 considers five different cases (A-E) at variable time since the polarization switch-on ($t_{ps}$) of the radio-frequency coil 120. Case A is the initial position ($t_{ps}=0$) where the "initial fluid" alone is fully inside the detector zone of the EFNMR detector 118. Case B shows the "intermediate fluid" flushing into the detection zone, while the "initial fluid" is flushing out of the detector zone. Case C has the "intermediate fluid" fully within the detection zone, which may only apply if $L_I \leq L_D$. The "outside fluid" is beginning to flush into the detection zone while the final fraction of the "initial fluid" is still flushing out of the detection zone. In Case D the "initial fluid" has now completely left the detection zone and the "intermediate fluid" is now flushing out of the detection zone. Finally, in Case E, the "intermediate fluid" has completely left the detection zone and the "outside fluid" will completely fill the EFNMR detector 118.

In Case E, the EFNMR detector 118 is now filled with oil-water fluid 128, which was not impacted by the non-adiabatic transition. Thus, the NMR signal will effectively be the same as if the fluid was polarized by the pre-polarizing permanent magnet 116. In order to quantify the signal variation due to non-adiabatic field transition ($S_{NA}$) at a given time since polarization pulse ($t_{ps}$), the following equation is applied:

$$S_{NA}(t_{ps}) = x_P(1-k_P) + x_I(1-k_I) + x_O$$

where $x_P$ is the fraction "initial fluid" within the detection zone, $x_I$ is the fraction of "intermediate fluid" within the detection zone and $x_O$ is the fraction of "outside fluid" within the detection zone. In some aspects, $S_{NA}$ replaces $S_P$ in Eq. (14).

The values of $x_P$, $x_I$, and $x_O$ are determined by selecting the relevant case (according to the time since polarization) from Table 500, whilst $k_P$ and $k_I$ are fractions of the "initial fluid" and "intermediate fluid" which observe non-adiabatic field transitions. The fraction parameters ($k_P$ and $k_I$) are determined by empirically fitting the parameters to signal loss measurements for water as a function of fluid velocity and time since the polarization pulse.

In some aspects, the fluid measurement system 100 may determine a velocity-$T_1$ distribution via a 2D inversion. Therefore, the velocity and $T_1$ distributions must be measured simultaneously as a joint 2D velocity-$T_1$ distribution. This may require consideration in the application of 2D inversion techniques. The model for NMR signal of a flowing fluid (Eq. (14)) now effectively describes the relationship between the experimental parameters (for example, $L_{PD}$, $t_{polz}$, and $t_e$) and the measured parameters (v and $T_1$) and is used as the model kernel function for 2D inversion. The kernel function can be considered in terms of the "direct" and "indirect" dimensions; the direct measurement is obtained from the single-shot FID signal which is detected ($S_D$), while the indirect measurement corresponds to variation in the pre-polarizing conditions ($S_P$). The model kernel function can be simplified as:

$$M(L_{PD}, t_{polz}, t_e, v, T_1) = S_P S_D \quad (15)$$

where $$S_D = \left(1 - \frac{t_e v}{L_D}\right) I(t_e, L_{PD}) e^{t_e R_T/T_1} \text{ for } t_e \leq \frac{L_D}{v}$$

where $S_P$ has been previously described in Eq. (8). The kernel function may be non-separable as the measured parameters (v and $T_1$) are present in both the direct and indirect dimensions. Therefore, a full kernel matrix (for example, a non-separable matrix) may be constructed to avoid undesirable consequences during data analysis. A pseudo-1D inversion may be applied (using appropriate matrix manipulation) with the full kernel matrix in order to determine the 2D velocity-$T_1$ probability distribution. The relevant linear inverse problem can be written as:

$$s(L_{PD}, t_{polz}, t_e) = M(L_{PD}, t_{polz}, t_e, v, T_1) P(v, T_1) \quad (16)$$

where $s(L_{PD}, t_{polz}, t_e)$ are the experimentally acquired NMR signals, $M(L_{PD}, t_{polz}, t_e, v, T_1)$ is the model kernel matrix described in Eq. (15), and $P(v, T_1)$ is the joint 2D probability distribution to be determined. The NMR signals consist of FID measurements acquired at variable pre-polarizing conditions (for example, variable distance 124 ($L_{PD}$) and variable time, $t_{polz}$) organized into a stacked signal vector. The row elements of the model kernel matrix describe changes in signal with respect to the experimental parameters (in other words, $L_{PD}$, $t_{polz}$, and $t_e$) and correspond to the signal vector components. The column elements of the model kernel matrix describe changes in the measured signal with respect to the measured parameters (v and $T_1$) and correspond to the solution vector components. The probability distribution vector (p) is determined using, for example, 1D Tikhonov regularization (via Eq. (2)). The resultant probability distribution vector is rearranged into the final 2D distribution ($P(v, T_1)$). The inversion procedure may take into account matrix arrangement and manipulation procedures. In some, aspects, the 1D distributions (p(v) and $p(T_1)$) may be readily determined by projecting the 2D distribution onto the relevant 1D axis.

The fluid measurement system 100 may apply a particular matrix manipulation technique for a pseudo-1D inversion. For example, the NMR signals from the EFNMR detector 118 include FID measurements (with $n_F$ points recorded for each FID) acquired at variable pre-polarizing conditions (for example, distance 124 and $t_{polz}$). The FID measurements may be compressed using window-averaging in order to obtain signal matrices of reasonable size for inversion processing. The FID signals are divided into $n_w$ equally sized windows or bins (FID signals may generally be dominated by a linear outflow effect; therefore using equally spaced windows is appropriate). The data points within each bin may be averaged to provide a compressed FID signal of size $n_w$. If FID measurements are acquired at $n_L$ different separation distances (for varying distances 124) and $n_T$ different polarization times, $t_{polz}$ (for additional pre-polarization at the radio-frequency coil 120), then there are $n_{pp} = n_L + n_T$ pre-polarization conditions.

Thus, the effective NMR measured signals will be of size $n_w \times n_{pp}$ (in other words, a 2D data matrix of $n_{pp}$ compressed FIDs each of length $n_w$). The signal matrix (S) may be unwrapped into a 1D signal column vector (s). If the solution matrix (P) for the probability distribution is to be of size $m_v \times m_{T1}$ then the relevant model kernel matrix (K) will be of size n×m (where $n = n_w n_{pp}$ and $m = m_v m_{T1}$). The row elements of the model kernel matrix describe changes in signal with respect to the experimental parameters (in other words, $L_{PD}$, $t_{polz}$ and $t_e$) and correspond to the signal vector components. The column elements of the model kernel matrix may describe changes in the measured signal with respect to the measured parameters (v and $T_1$) and correspond to the solution vector components.

The measured signals (s) have now been appropriately manipulated such that the signal vector is of length $n = n_w n_p$ and the model kernel (K) has been manipulated to provide a matrix of size n×m in order to solve the solution vector (p) of length m with 1D Tikhonov regularization. The vector and matrix are also of appropriate size to ensure reasonable computational efficiency. In some aspects, the smoothing operation matrix (Q) must be carefully constructed to calculate the finite second difference across 2D solution space (hence approximating the second derivative of the P). The resultant solution is returned as a vector (p) is of length m and is reshaped into the final 2D distribution (P of size $m_v \times m_{T1}$).

Once the joint 2D velocity-$T_1$ probability distribution is determined, such distribution can be used to calculate individual phase flowrates of the oil 104 and the water 108. The oil and water phases are distinguished with a $T_1$ cutoff value ($T_{1,C}$), which is used to differentiate the oil 104 and the water 108 (for example, similar to $T_2$ cut-offs used to differentiate bound fluid and free fluid in NMR analysis of rock cores). In some aspects, a cut-off of $T_{1,C} = 0.60$ s is used (calculated as the geometric mean of the $T_1$ values for the oil (115 ms) and water (3.1 s)). The relevant signal contribution of each liquid is calculated by integrating over the relevant region of the joint probability distribution:

$$S_{oil} = \int_{T_{1,min}}^{T_{1,k}} \int_0^{v_{max}} P(v, T_1) dv dT_1 \quad (17)$$

$$S_{water} = \int_{T_{1,k}}^{T_{1,max}} \int_0^{v_{min}} P(v, T_1) dv dT_1 \quad (18)$$

where $S_{oil}$ and $S_{water}$ are the oil and water signal contribution to the model fit respectively, $T_{1,min}$ and $T_{1,max}$ define the bounds of the discretized $T_1$ range, and $v_{max}$ is the maximum value in the discretized velocity range. The phase fractions can be calculated from the relevant signal contribution of each phase:

$$x_w = \frac{HI_{oil}}{HI_{oil} + \frac{S_{oil}}{S_{water}}} \quad (19)$$

$$x_o = 1 - x_w \quad (20)$$

where $x_w$ is the water phase fraction (water-cut), $x_o$ is the oil phase fraction, and $HI_{oil}$ is the hydrogen index for the oil 104, which has been determined by comparing the measured signal intensity of the oil and water samples obtained during CPMG measurements in an NMR rock core analyzer (for example, a Magritek 2 MHz NMR rock core analyzer). The individual phase velocity distributions ($p(v_o)$ and $p(v_w)$ for oil and water respectively) are determined by integrating the relevant regions of the 2D distribution:

$$p(v_o) = \int_{T_{1,min}}^{T_{1,k}} P(v, T_1) dT_1 \quad (21)$$

$$p(v_w) = \int_{T_{1,k}}^{T_{1,max}} P(v, T_1) dT_1 \quad (22)$$

The mean velocity for each phase ($v_{M,o}$ and $v_{M,w}$ for the oil 104 and the water 108, respectively) can then be determined by calculating the expected value for each phase velocity distribution:

$$v_{M,i} = \int_0^{v_{max}} v_i p(v_i) dv_i \quad (i = \text{oil or water}) \quad (23)$$

Finally, individual phase volumetric flowrates ($q_o$ and $q_w$ for the oil 104 and the water 108, respectively) can be calculated:

$$q_i = x_i v_{M,i} A \quad (i = \text{oil or water}) \quad (24)$$

where A is the internal cross-sectional area of the conduit 150. The phase flowrates of the oil 104 and the water 108, which are measured from the NMR signal analysis methodology, in some aspects, can be verified against independent flowrate measurements from the flow meters 132 and 134, respectively, of single-phase flow obtained prior to mixing the oil 104 and the water 108 into the oil-water fluid 128 by the fluid mixer 114.

Figure 6A:
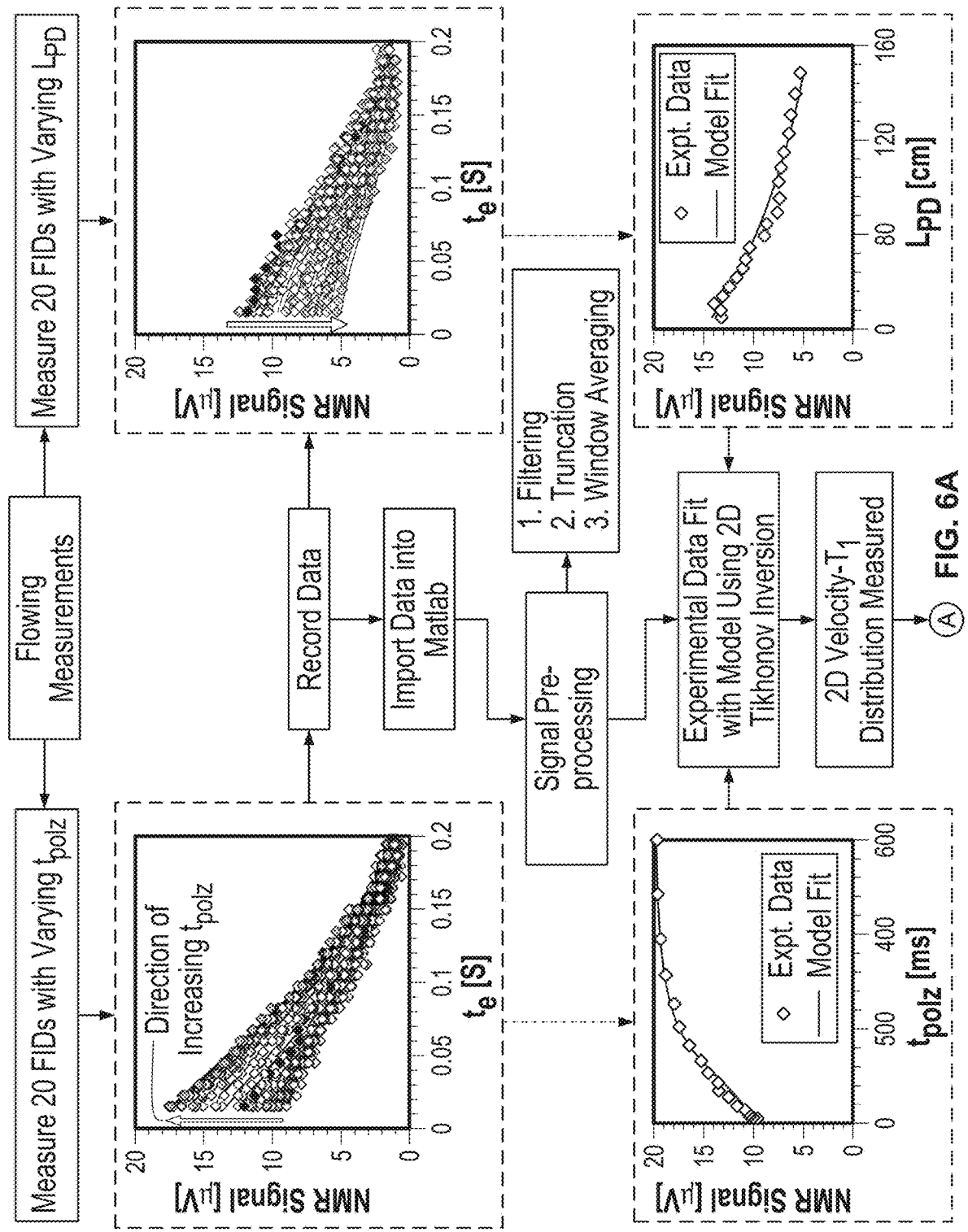
FIGS. 6A-6B illustrate a process diagram for an example operation process executed with a fluid measurement system according to the present disclosure.
Figure 6B:
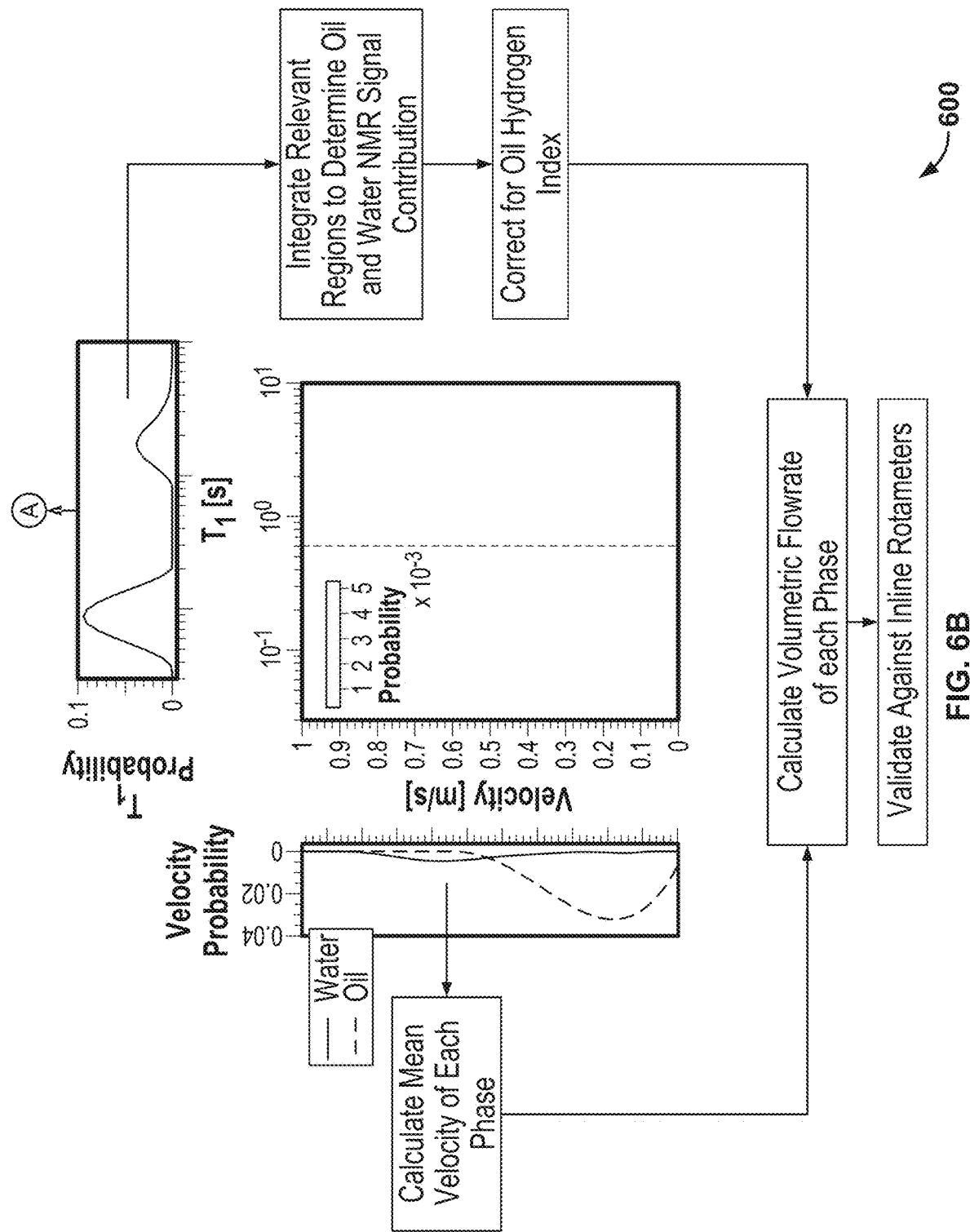

An example operation process 600 executed with the fluid measurement system 100 is shown in FIGS. 6A-6B. Process 600 includes a description of steps in a procedure applied to measure the fluid flowrates using the fluid measurement system 100. The procedure, in this example, is applied with the control system 122 executing. for example, Prospa software (from Magritek, New Zealand) to capture twenty FID measurements at varying separation distance 124 ($L_{PD}$) and twenty FID measurements at varying pre-polarization times ($t_{polz}$). Once the FID data has been recorded, it may be imported into, for example, Matlab R2017b, for signal processing and analysis.

A series of pre-processing steps may be applied to the imported FID data such that the FID data is suitable for inversion. For example, a Gaussian noise filter may be implemented on the measured FID spectrums primarily to remove the influence of 50 Hz mains noise. The FIDs may then be truncated at the point where the SNR reaches 1 (in other words, data with SNR<1 is removed), such that the baseline noise does not influence the signal and introduce artifacts in the resulting 2D velocity-$T_1$ distribution.

The truncated signals may then be window-averaged such that the data is of appropriate size for computationally efficient inversion. The processed FID data may then be fit with the appropriate 2D velocity-$T_1$ distribution using the NMR flow model (Eq. (15)) via the 2D Tikhonov regularization inversion (Eq. (2)). The 2D regions of the velocity-$T_1$ distribution may be appropriately integrated in order to determine the relevant signal contribution of each phase (according to Eqs. (17) and (18)). The signal contributions may be corrected for the oil hydrogen index in order to quantify volumetric fluid fractions (according to Eqs. (19) and (20)). The expected value of each of the individual phase velocity distributions may be calculated in order to quantify mean velocity (according to Eq. (23)). Finally, the individual volumetric flowrates for the water 108 and the oil 104 may be calculated from the volumetric phase fractions and phase mean velocities (using Eq. (24)).

As previously described, the resultant individual volumetric flowrates determined according to the FID data and inversion process may be checked against the independent flowrate measurements from the flow meters 132 and 134 for accuracy. Such analysis may also include consideration of the range of liquid-liquid flow regimes within the conduit 150 of the oil-water fluid 128. There may be six different oil/water flow regimes including; stratified flow (St), stratified flow with mixing at the interface (St w/mix), a dispersion of oil-in-water over a free water layer (Do/w & w), a dual dispersion of water-in-oil over oil-in-water (Do/w & Dw/o), a full oil-in-water emulsion (Eo/w) and a full water-in-oil emulsion (Ew/o). Experimental executions with the fluid measurement system 100 included twenty-one experimental flow measurements in three flow regime: stratified with mixing (10 measurements), dispersion of oil-in-water and water (3 measurements), and full oil-in-water emulsions (8 measurement). FIG. 7 illustrates a table 700 that shows a summary for the three relevant flow regimes including the appropriate region on a flow regime map, a schematic and a photograph.

Figure 8:
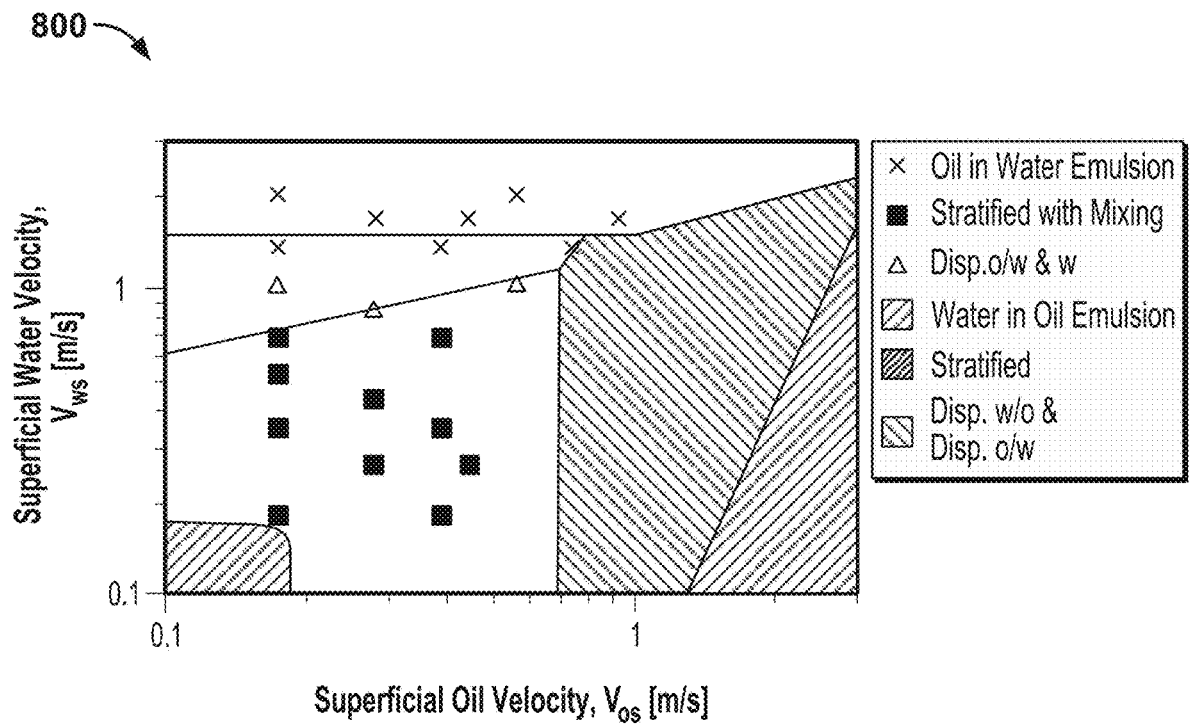
FIG. 8 illustrates a graph that shows an experimental matrix of oil and water superficial velocities to be used for verification of a fluid measurement system according to the present disclosure.

Further, a graph 800 that shows an experimental matrix of oil and water superficial velocities to be used for verification of the NMR flow measurement procedure is illustrated in FIG. 8. The water superficial velocities range from 0.18 to 2.03 m/s (corresponding to flowrates of 1.00-11.1 m³/h) and the oil superficial velocities range from 0.17 to 0.92 m/s (corresponding to flowrates of (1.00-5.00) m³/h). The visually observed flow regime for each measurement point is indicated by the marker type and shade on graph 800, with the flow regime boundaries indicated with black lines. Here, the experiments with the fluid measurement system 100 were conducted with saline tap water as the water 108 and canola oil as the oil 104, with a pipe diameter of 44.0 mm of conduit 150, density ratio of 0.86, and a viscosity ratio of 44.0.

Figure 9:
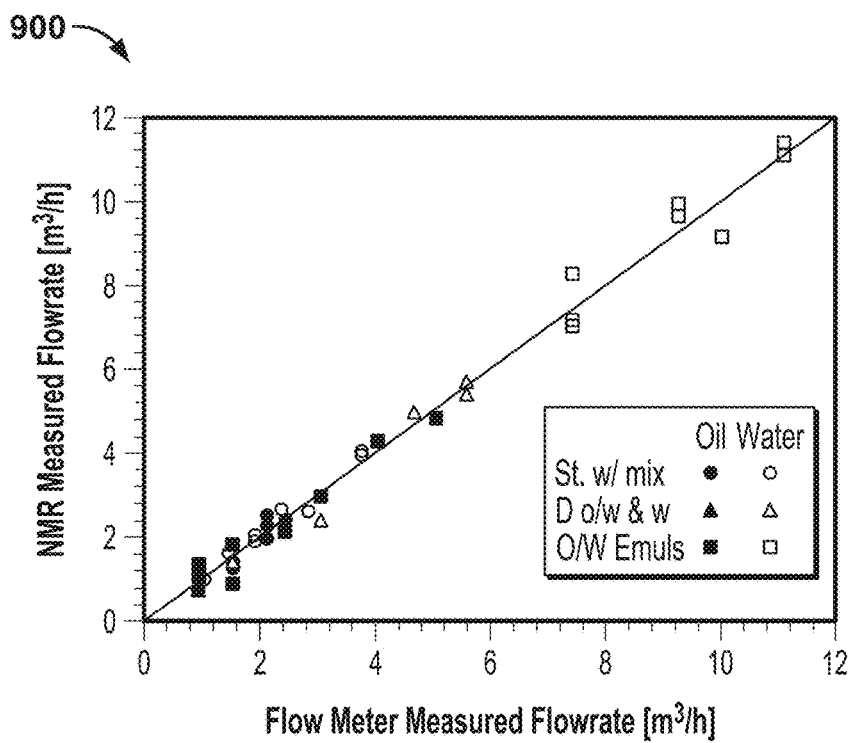
FIG. 9 illustrates a graph that compares individual flowrates of oil and water in an oil-water fluid circulating through a fluid measurement system according to the present disclosure to corresponding flow meter measured phase volumetric flowrates for the oil and the water 108 individually flowing through the fluid measurement system.

Two-phase flow measurements were performed for each of the 21 flow measurement points displayed in the graph 800 and each measurement was analyzed according to the NMR flow measurement procedure of the present disclosure. FIG. 9 illustrates a graph 900 that compares the NMR measured flowrates according to the present disclosure for each individual phase to the corresponding flow meter (132 or 134) measured phase volumetric flowrates for both the oil 104 and the water 108. The visually observed flow regime for each measurement is indicated according to the marker shape in graph 900.

FIG. 9 shows the NMR measured flowrates compare very well to the measured flowrates (by the flow meters 132 and 134) for both the oil 104 and the water 108. The absolute errors appear to be slightly higher for the water measurements in the oil-in-water emulsion flow regime. A statistical comparison between the flow measurement techniques is performed in order to quantify the relative performance in each flow regime. The mean error (ME) quantifies how well an observed measurement (in other words, flowrate measurements according to the EFNMR detector 118 and control system 122) matches a reference measurement (in other words, flowrate measurement by the flow meters 132 and 134). The mean error for a sample (of size N) is:

$$ME = \frac{\sum_{n=1}^{N} z_{i,obs} - z_{i,ref}}{N} \tag{25}$$

where $z_{i,obs}$ is the observed measurement of the variable of interest (flowrate measurements according to the EFNMR detector 118 and control system 122) for sample, i, and $z_{i,ref}$ is the reference measurement of the property of interest (flowrate measurement by the flow meters 132 and 134) for sample, i. The root-mean-square error (RMSE) quantifies accuracy in terms of the standard deviation of the residual errors of observed measurements relative to a reference measurement. The RMSE for a set of flow measurements (of sample size N) is:

$$RMSE = \sqrt{\frac{\sum_{n=1}^{N}(z_{i,obs} - z_{i,ref})^2}{N}} \tag{26}$$

Figure 10A:
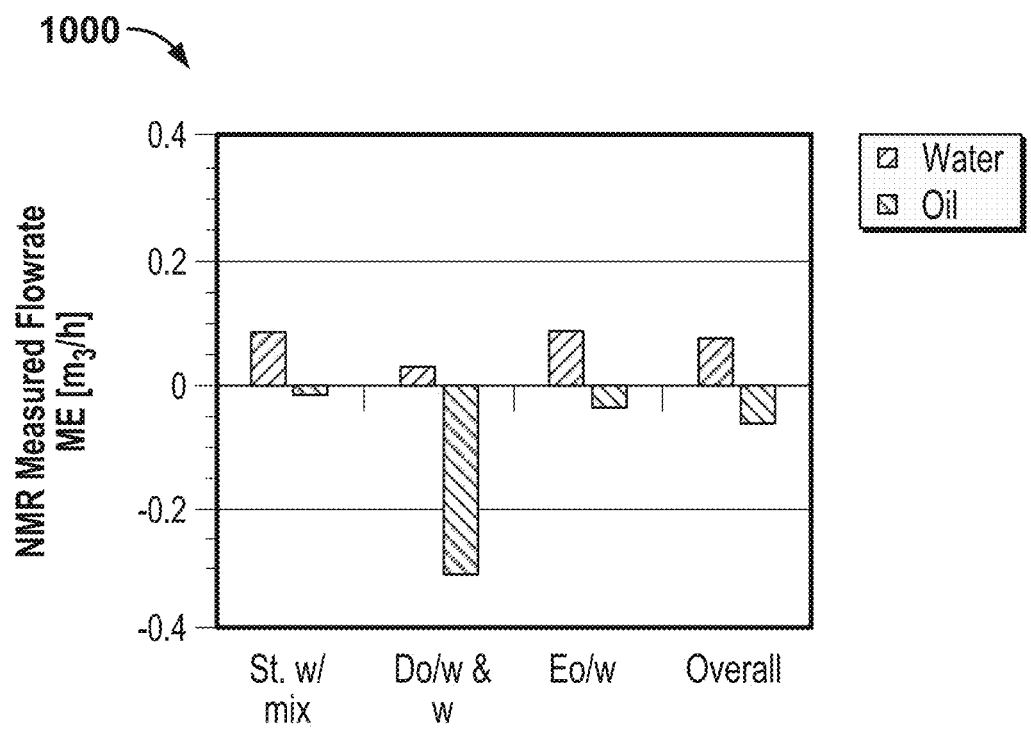
FIGS. 10A-10B illustrate graphics that illustrate a mean error and a root mean square error of the observed measurements relative to the reference measurements taken with a fluid measurement system according to the present disclosure.
Figure 10B:
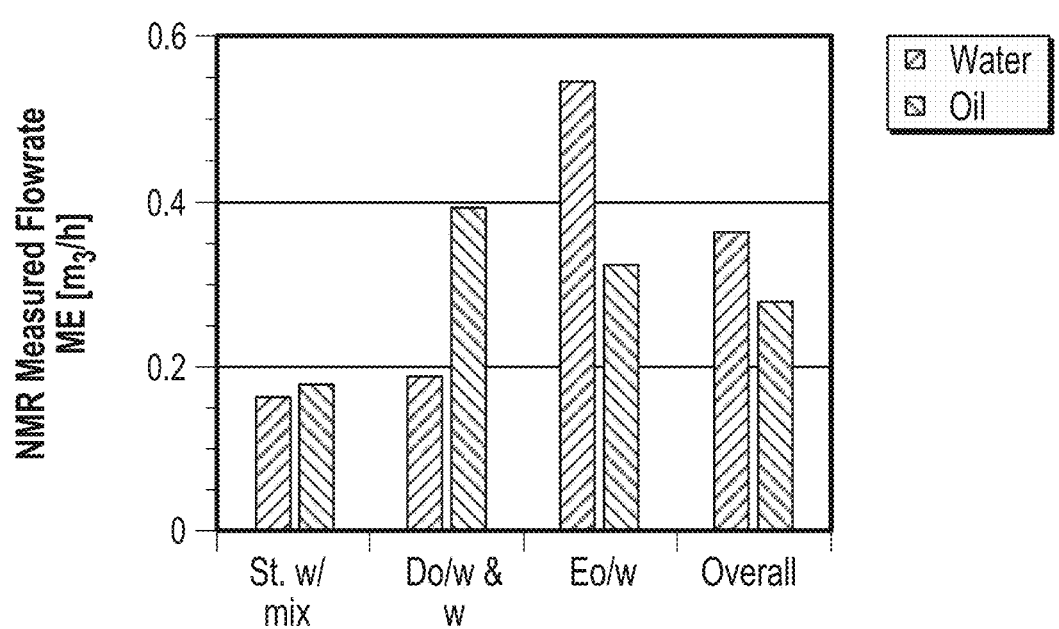

FIG. 10A illustrates a graph 1000 that represents the mean error and FIG. 10B illustrates a graph 1010 that represents the root mean square error of the observed measurements relative to the reference measurements. The summary statistics are presented for both oil and water measurements across the three observed flow regimes, as well as the overall values across all 21 measurements.

FIG. 10A further demonstrates the good agreement between the observed measured flowrates and the reference measured flowrates. In graph 1000, the mean error is less than 0.10 m³/h across all flow regimes; except for the oil flowrate measurement in the dispersion of oil-in-water and water flow regime. This flow regime only had three experiments, and the example presented in graphic 1110 of FIG. 11B (with a deviation of about 0.66 m³/h) demonstrates the source of this discrepancy. For mid-range oil velocities (about 1.4 m/s) there is loss of measurement sensitivity due to the poor SNR measured in this velocity-$T_1$ range. The velocity is between the effective regions of the two polarizing mechanisms; the pre-polarizing magnet 116 achieves improved polarization at higher velocities, whilst the electromagnetic radio-frequency coil 120 achieves improved polarization at lower velocities.

The root mean square errors in graph 1010 also demonstrate the excellent agreement between flow measurement techniques. There is good agreement in the stratified with mixing flow regime (RMSE<0.20 m³/h for both oil and water), as the two-phase flow stream is not emulsified and the low overall flowrate gives the fluid sufficient residence time for the two phases to separate in the fluid separation tank 126. The flowrate agreement is marginally poorer for the oil-in-water emulsion, primarily due to the reduced separation efficiency, particularly at higher flowrates. The oil-in-water emulsion flow regime results in an emulsified mixture to be separated in the fluid separation tank 126.

The efficiency of separation is dependent on the residence time of the mixture within the separator 126. For example, for the measurement displayed in graphic 1120 of FIG. 11C, the overall fluid flowrate is 8.96 m³/h, which means for a separation volume of 128 L, the separation residence time will be about 51 s. This may not be enough to achieve full separation of the oil and water emulsion; therefore the oil will contaminate the water storage tank 106 and vice versa. This is may be more problematic for the oil tank 102, where the unseparated emulsion (which is denser than the pure oil phase 104) may sink to the bottom of the tank 102. The tank outlet may then discharge the emulsion. This causes the water fraction to increase gradually throughout the duration of the NMR flow measurement sequence. This results in slightly poorer comparison errors (RMSE of 0.55 m³/h for water and 0.32 m³/h for oil) in the oil-in-water flow regime. However the overall flow measurement performance (RMSE of 0.36 m³/h for water and 0.30 m³/h for oil) is still very good for two-phase oil/water measurements.

Figure 11A:
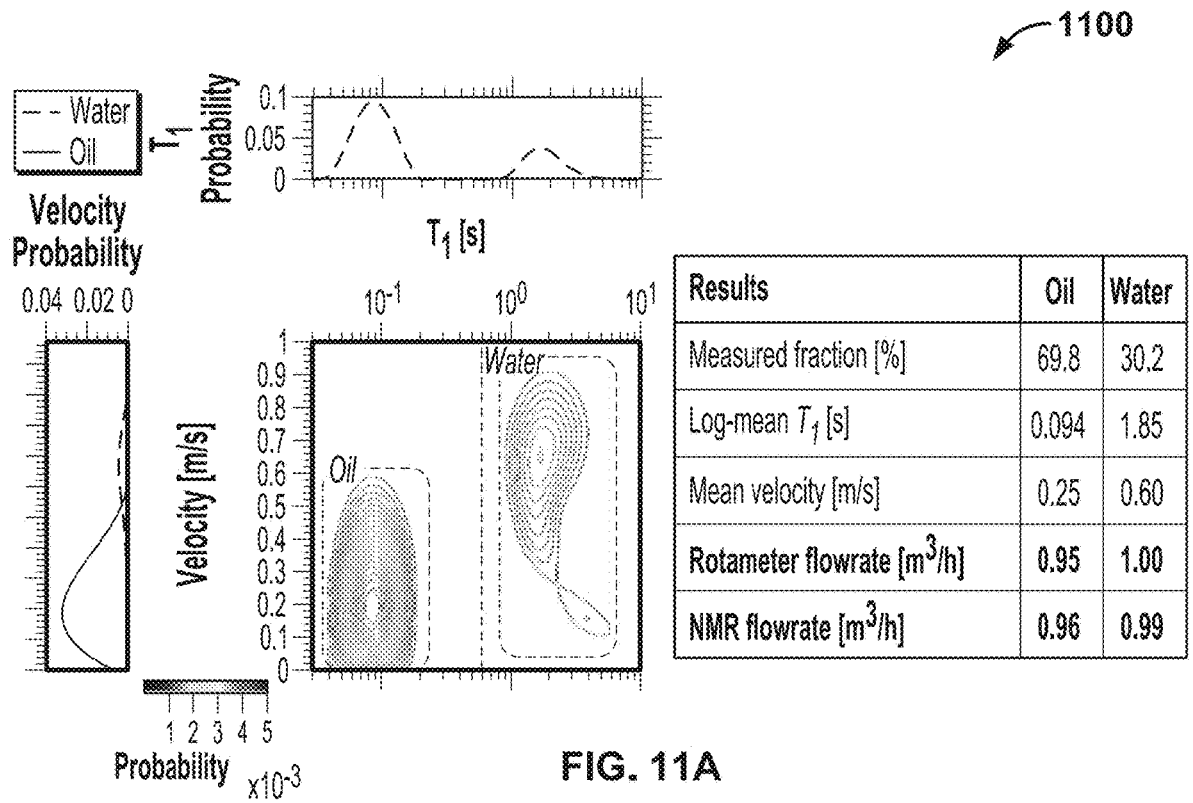
FIGS. 11A-11C illustrate graphics that illustrate experimental measurements for different flow regimes within a fluid measurement system according to the present disclosure.
Figure 11B:
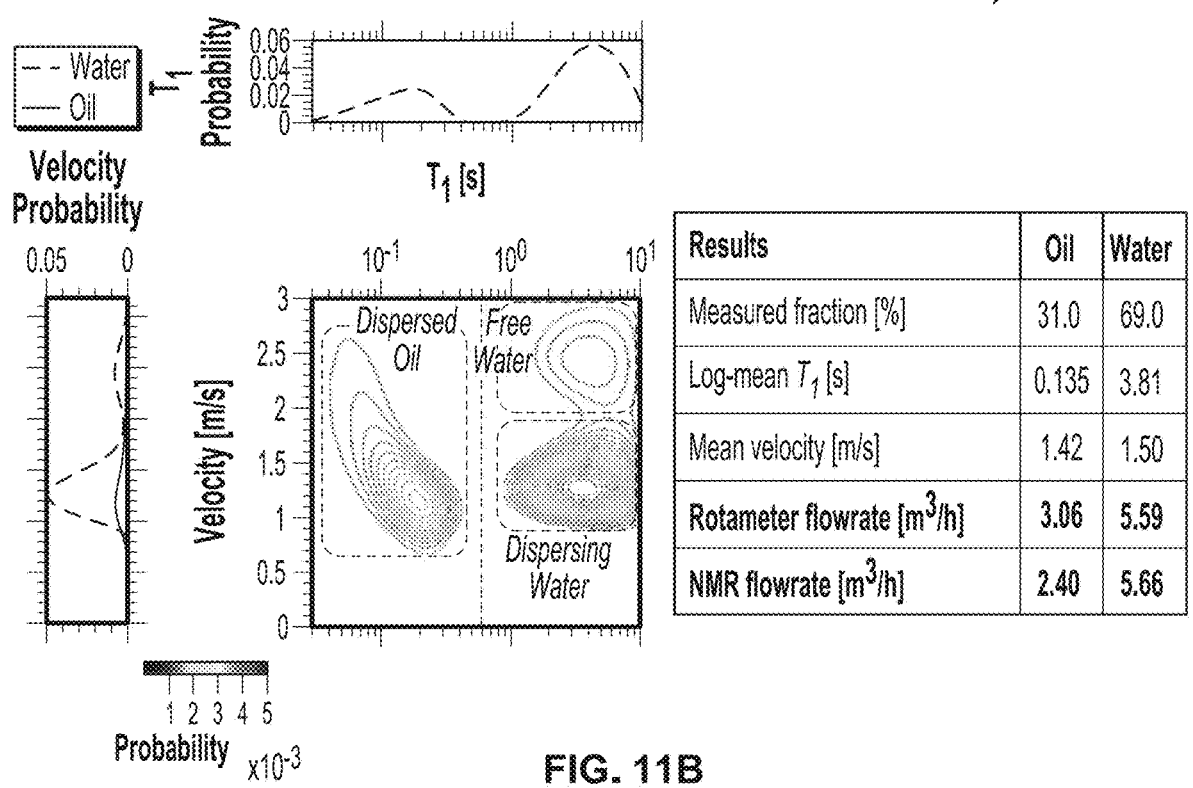
Figure 11C:
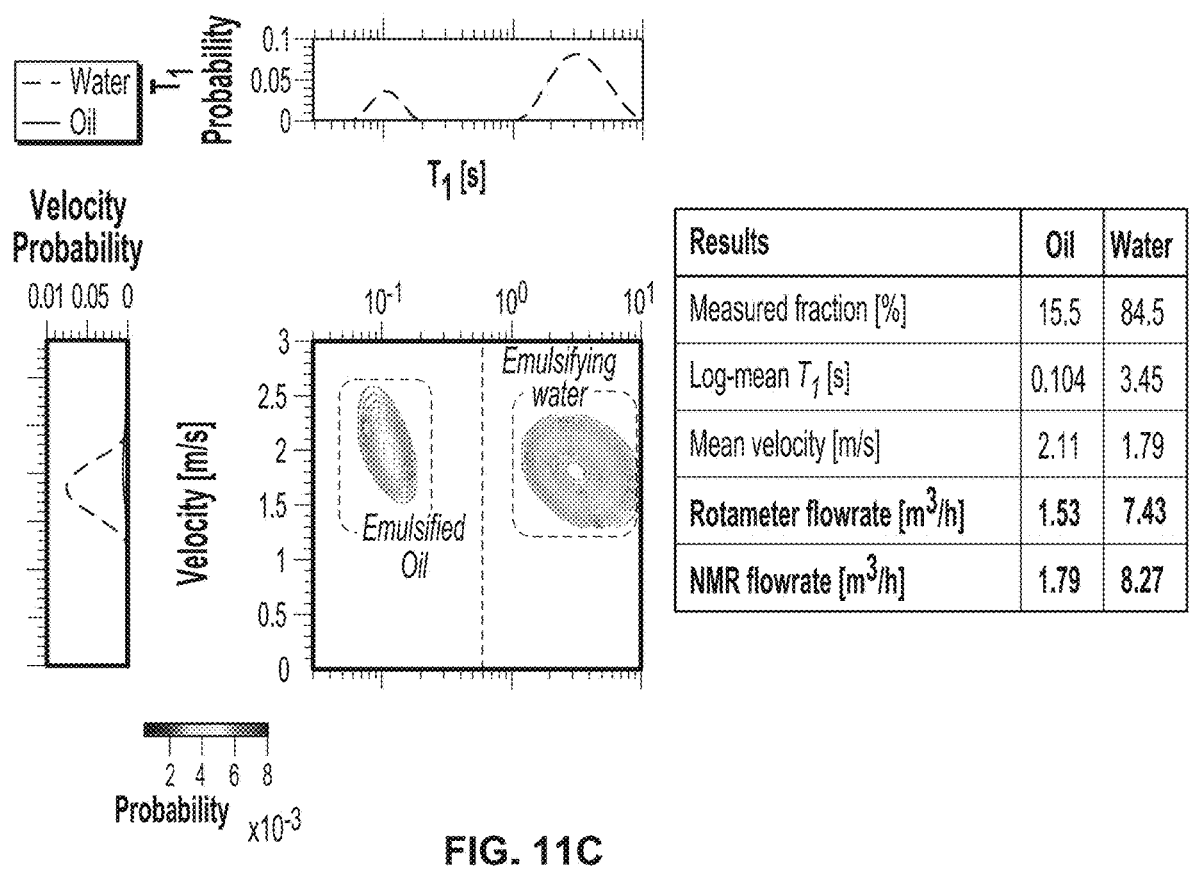

The EFNMR flow measurement procedure according to the present disclosure is also analyzed with respect to three example measurements from each of the three measurable flow regimes. FIGS. 11A-11C illustrate the measured the 2D velocity-$T_1$ probability distributions with a particular graphic (1100, 1110, 1120) for a particular flow regime. Graphic 1100 shows an example measurement from the stratified with mixing flow regime with a water flowrate of 1.00 m³/h and an oil flowrate of 0.95 m³/h. Graphic 1110 shows a measurement from the dispersion of oil-in-water and water flow regime for a water flowrate of 5.59 m³/h and an oil flowrate of 3.06 m³/h. Graphic 1120 presents an example distribution from the oil-in-water emulsion flow regime at a water flowrate of 7.43 m³/h and an oil flowrate of 1.53 m³/h. For each measurement, the 2D velocity-$T_1$ distribution has been fit to the experimentally measured FID signals with the model kernel given by Eq. (15). Each 2D velocity-$T_1$ distribution is projected into the relevant marginal 1D probability distributions with the velocity distributions also segregated into the relevant phase velocity probability distributions for the oil 104 and the water 108.

Each of the examples presented in FIGS. 11A-11C are also individually analyzed. The 2D velocity-$T_1$ distribution illustrated in graphic 1100 shows two separate regions with distinguishable $T_1$ relaxation. The distribution is reflective of the stratified with mixing flow regime consisting of two segregated layers of fluid in the pipe cross section with water on the bottom layer and oil on the top layer. The oil region ($T_{1,LM}$=0.094 s, $v_M$=0.25 m/s) displays a lower velocity relative to the water region ($T_{1,LM}$=1.85 s, $v_M$=0.60 m/s). The measured velocity difference is capturing the velocity slip that exists between the two liquid phases in the stratified flow regime. The oil 104 has a much higher viscosity (55 cP) relative to the saline water (about 1.25 cP). The lower viscosity results in a higher fluid-wall frictional force for the oil 104 leading to a lower velocity relative to the water 108. Note that for the similar flowrates of 1.00 m³/h and 0.95 m³/h for water and oil respectively, the higher water velocity will correspond to a higher oil fraction. The accuracy of the measurement for this example is excellent; the EFNMR measured oil flowrate (0.96 m³/h) deviates from the flow meter 132 measured oil flowrate (0.95 m³/h) by only 0.01 m³/h, whilst the water flowrate (0.99 m³/h) deviates from the flow meter 134 measured water flowrate (1.00 m³/h) by about 0.01 m³/h.

The 2D velocity-$T_1$ distribution in graphic 1110 for the dispersion of oil-in-water above a water layer measurement displays three distinct regions. The region at short $T_1$ corresponds to the dispersed oil droplets in the top layer (fraction=31.0%, $T_{1,LM}$=0.135 s, $v_M$=1.42 m/s). The large dispersing water region at the lower velocity (fraction=55.3%, $T_{1,LM}$=3.74 s, $v_M$=1.31 m/s) corresponds to water with oil droplets dispersed within it. The small "free water" region at high velocity (fraction=13.7%, $T_{1,LM}$=4.30 s, $v_M$=2.42 m/s) is water from the water only layer (at the base of the conduit 150). The free water layer is relatively small (13.7%) as the oil flowrate is relatively high for a dispersion of oil-in-water and water flow, meaning that the two-phase flow is beginning to approach the flow regime boundary and transition towards a dual dispersion flow. The measurement is able to capture the anticipated velocity slip for this example; the fluids within the dispersion layer (for example, the dispersed oil drops and the water phase containing the oil) both have very similar velocities which is anticipated for a continuous layer. The water only phase (on the bottom layer of the conduit 150) is observed to be at marginally higher velocity relative to the dispersion components. This is expected as the dispersion will be more viscous relative to the water only phase. The EFNMR measured water flowrate ($q_{w,nmr}$=5.66 m³/h) matches the flow meter 134 measured water flowrate ($q_{w,rot}$=5.59 m³/h) very well. However the EFNMR measured oil flowrate ($q_{o,nmr}$=2.40 m³/h) is under predicted relative to the flow meter 132 measured oil flowrate. ($q_{o,rot}$=3.06 m³/h). This discrepancy can be attributed to the poor SNR of oil flows at intermediate velocities.

The 2D distribution in graphic 1120 displays a small region at short $T_1$ corresponding to the emulsified oil ($T_{1,LM}$=0.104 s, $v_M$=2.11 m/s) and a large region at high $T_1$ corresponding to water ($T_{1,LM}$=3.45 s, $v_M$=1.79 m/s). The velocity slip ratio is determined to be 1.18 from the measured velocity-$T_1$ distribution. For this measurement, the EFNMR measured water flowrate ($q_{w,nmr}$=8.27 m³/h) is over-predicted relative to the flow meter 134 measured flowrate ($q_{w,rot}$=7.43 m³/h). The EFNMR measured oil flowrate ($q_{o,nmr}$=1.79 m³/h) is reasonably close to the flow meter 132 measured flowrate ($q_{o,rot}$=1.53 m³/h). The suggested source of discrepancy for the water flowrate measurement is inadequate residence time required for separation of the oil-in-water emulsion.

Figure 2:
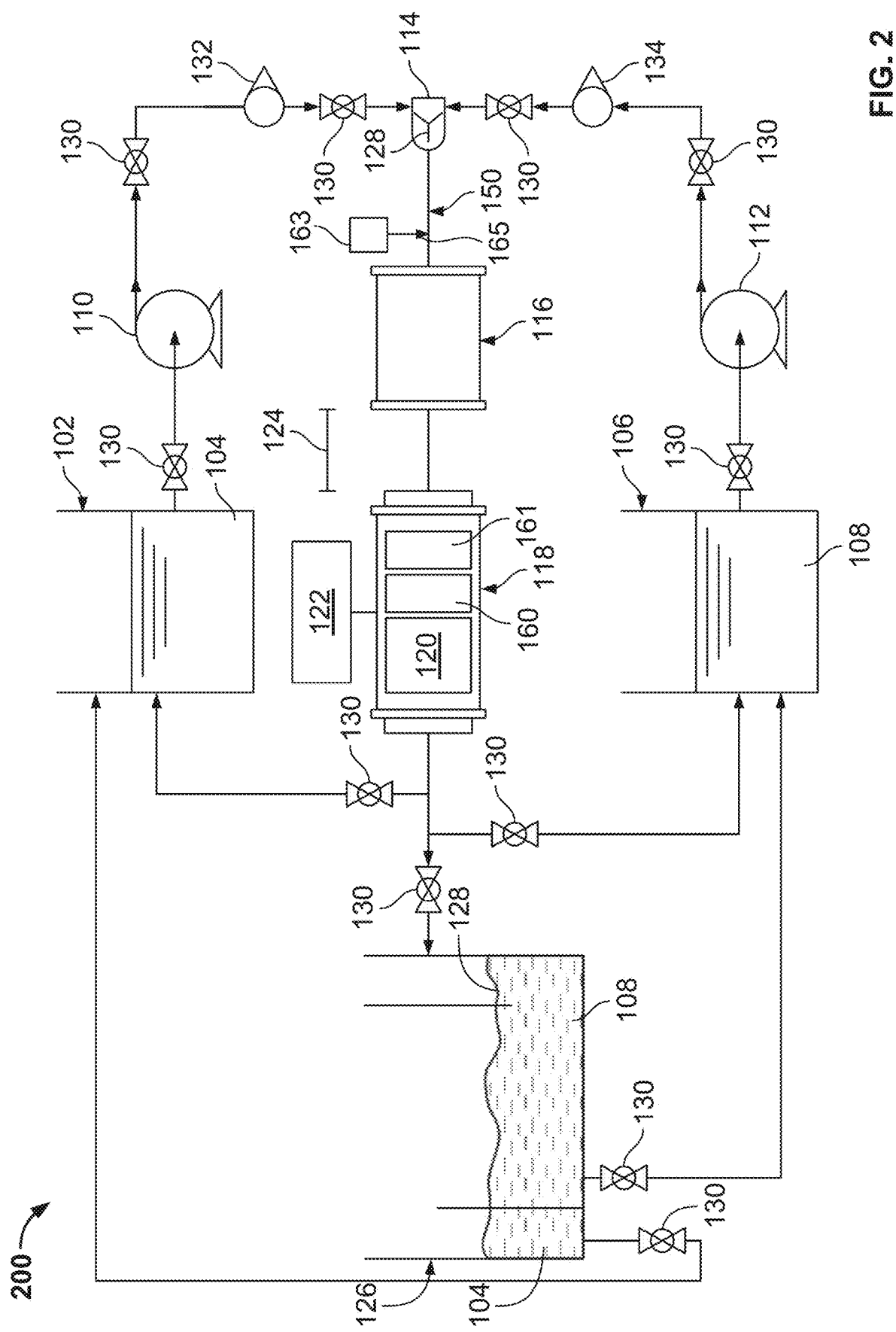
FIG. 2 is a schematic diagram of another example implementation of a fluid measurement system according to the present disclosure.

Turning now to FIG. 2, this figure illustrates another example implementation of a fluid measurement system 200 according to the present disclosure. Fluid measurement system 200 may be substantially similar to the fluid measurement system 100, and in this figure, like reference symbols indicate like components of the fluid measurement system 100. However, as shown in FIG. 2, fluid measurement system 200 includes electromagnets 161 and 160. In this example, the electromagnet 161 creates a pulsed magnetic field gradient. Electromagnet 161, in some aspects, is aligned with the radio-frequency coil 120 of the EFNM detector 118 (for example, fits around the coil 120). The electromagnet 160 creates a reasonably homogeneous polarizing field. In some aspects, the electromagnet 160 can fit externally about the electromagnet 161 or may be positioned immediately upstream (in other words, between the EFNMR detector 118 and the pre-polarizing permanent magnet 116) of the electromagnet 161.

In some aspects, the oil-water fluid 128 comprises both a liquid phase (for example, a mix of liquid oil 104 and liquid water 108) and a gas 165 (for example, methane or other hydrocarbon gas) that is introduced into the oil-water fluid 128 with a compressor 163. Thus, with respect to the fluid measurement system 200, the oil-water fluid 128 is a mixed-phase fluid 128.

In some aspects, the pre-polarizing magnet 116 and the first electromagnet 161 are operated in combination with the pre-polarizing permanent magnet 116, the radio-frequency coil 120, and the EFNMR detector 118, to determine the velocities of the liquid and gas phases of the mixed-phase fluid 128, as well as the oil-water content of the liquid phase of the mixed-phase fluid 128. For example, a velocity of the liquid phase of the mixed-phase fluid 128 may be determined as follows. As the mixed-phase fluid 128 is circulated through the pre-polarizing permanent magnet 116, an initial polarization of the gas phase is applied to the mixed-phase fluid 128 by the pre-polarizing permanent magnet 116. As the initially polarized mixed-phase fluid 128 flows through the EFNRM detector 118 and during acquisition of the FID values with the radio-frequency coil 120, the electromagnet 161 is energized to produce the pulsed magnetic field gradient that suppresses the NMR acquired signals from the gas phase (which is faster flowing and diffusing relative to the liquid phase) of the mixed phase fluid 128. The electromagnet 160 is also operated to produce the reasonably homogenous magnetic field to polarize the liquid phase of the mixed-phase fluid 128. Based on the acquired signals in this operation, the EFNRM detector 118 determines a velocity of the liquid phase only of the mixed-phase fluid 128. Such velocities may be determined, for example, based on a pseudo-1D inversion to the acquired FID values of the liquid phase, as previously described.

A velocity of the gas phase of the mixed-phase fluid 128 may be determined as follows. As the mixed-phase fluid 128 is circulated through the pre-polarizing permanent magnet 116, an initial polarization of the gas phase is applied to the mixed-phase fluid 128 by the pre-polarizing permanent magnet 116. As the initially polarized mixed-phase fluid 128 flows through the EFNRM detector 118 and during acquisition of the FID values with the radio-frequency coil 120, neither electromagnet 160 nor 161 is energized. Based on the acquired signals in this operation, the EFNRM detector 118 determines a velocity of the gas phase only of the mixed-phase fluid 128. Such velocities may be determined, for example, based on a pseudo-1D inversion to the acquired FID values of the gas phase, as previously described.

The content distribution of the oil 104 and water 108 in the liquid phase may also be determined by the fluid measurement system 200 in similar fashion to the previous operations described with reference to the fluid measurement system 100 of FIG. 1. For example, as the mixed-phase fluid 128 circulates through the EFNMR detector 118, the electromagnet 160 is energized subsequent to an initial polarization of the mixed-phase fluid 128 by the pre-polarizing permanent magnet 116. In this operation, the electromagnet 160 is energized and the homogeneous polarizing field is generated. In some aspects, the separation distance 124 of the fluid measurement system 200 may be greater than 150 cm, which may be larger than the distance typically used in fluid measurement system 100. As described previously, the oil-water content of the liquid phase of the mixed-phase fluid 128 is determined according to the $T_1$ differences for the FID signals from the EFNMR detector 118.

Figure 12A:
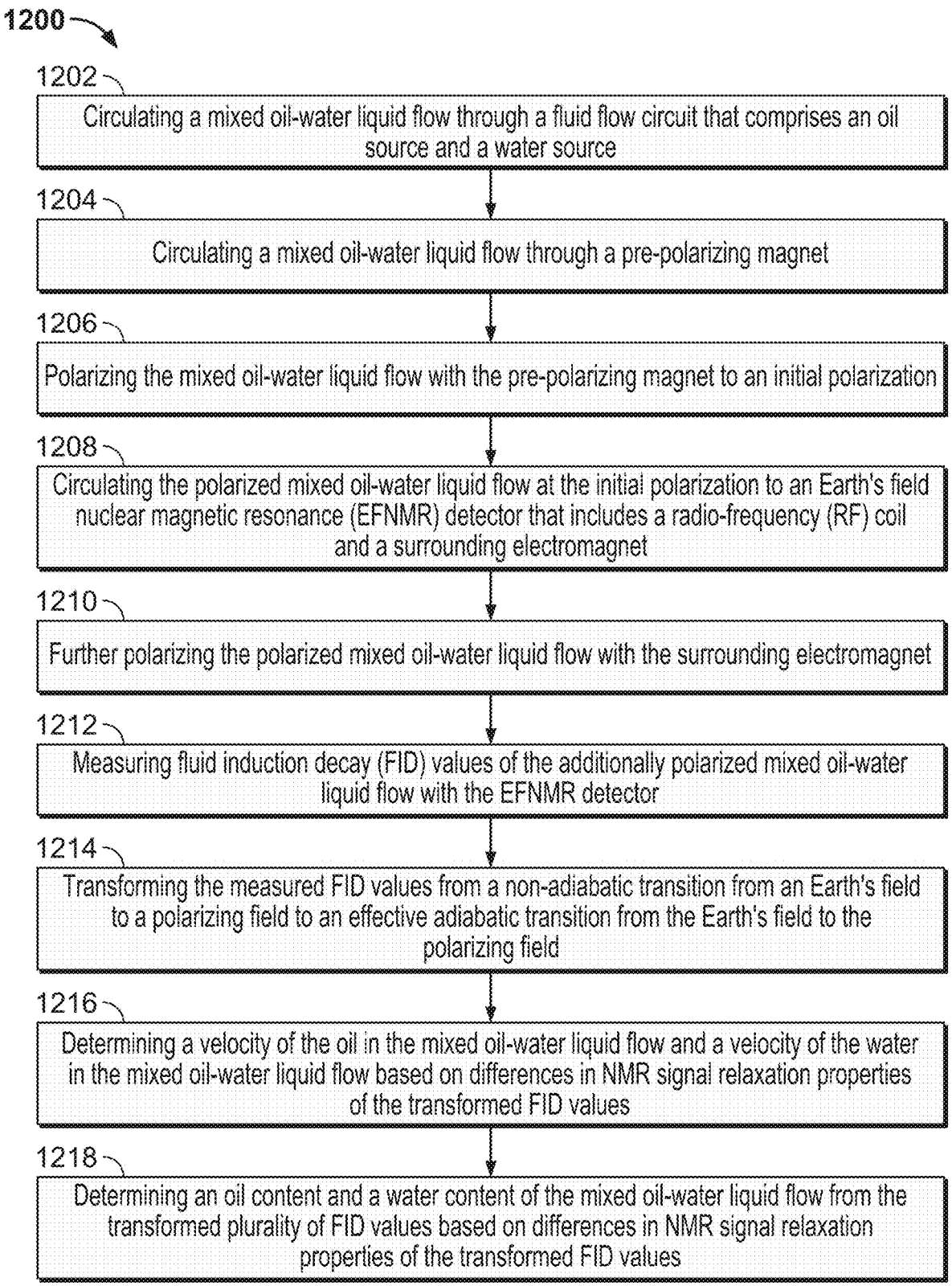
FIGS. 12A-12B illustrate flowcharts that describe example methods performed with a fluid measurement system according to the present disclosure.

Turning now to FIG. 12A, this figure illustrates a flowchart that describes an example method 1200 for determining oil-water content in an oil-water fluid. In some aspects, all or part of the example method 1200 can be implemented by or with the control system 122 and, more generally, the fluid measurement system 100 shown in FIG. 1. Method 1200 may begin at step 1202, which includes circulating a mixed oil-water liquid flow through a fluid flow circuit that comprises an oil source and a water source. For example, the oil 140 and the water 108 may be circulated (by pumps 110 and 112, respectively) from tanks 102 and 106 (respectively) to the fluid mixer 114 and mixed into the oil-water fluid 128.

Method 1200 may continue at step 1204, which includes circulating the mixed oil-water liquid flow through a pre-polarizing magnet. For example, the oil-water fluid 128 is circulated through conduit 150 and into the pre-polarizing magnet 116. In some aspects, the pre-polarizing magnet 116 is a Halbach array.

Method 1200 may continue at step 1206, which includes polarizing the mixed oil-water liquid flow with the pre-polarizing magnet to an initial polarization. For example, the pre-polarizing magnet 116 polarizes the oil-water fluid 128 to the initial polarization by, for example, applying the 0.3 T Halbach array, which is located at a particular distance ($L_{PD}$) from an EFNMR detector 118. The distance may be varied, for example, between 45 and 150 cm.

Method 1200 may continue at step 1208, which includes circulating the polarized mixed oil-water liquid flow at the initial polarization to an Earth's field nuclear magnetic resonance (EFNMR) detector that includes a radio-frequency (RF) coil and a surrounding electromagnet. For example, once the oil-water fluid 128 is polarized by the pre-polarizing magnet 116, the oil-water fluid 128 is circulated to the EFNMR detector 118.

Method 1200 may continue at step 1210, which includes further polarizing the polarized mixed oil-water liquid flow with the surrounding electromagnet. For example, once within the polarization area of the electromagnet, the fluid is additionally polarized by the electromagnet of the EFNRM detector 118 (in other words, in a dual-polarization scheme).

Method 1200 may continue at step 1212, which includes measuring fluid induction decay (FID) values of the additionally polarized mixed oil-water liquid flow with the EFNMR detector. For example, the dually-polarized oil-water fluid 128 flows through the EFNMR detector, in which the FID values are measured. In some aspects, the FID values include relaxation time constants ($T_1$ and $T_2$) associated with the fluids of interest, both of which quantify the rate of energy transfer in magnetic resonance processes. The spin-lattice relaxation rate ($T_1$) is a fluid property describing the rate of signal accumulation in a magnetic field, while the spin-spin relaxation rate ($T_2$) describes the rate of signal decay or dephasing of hydrogen atoms within a fluid. In some aspects, the FID values are a function of velocity and $T_1$ values.

In some aspects, step 1212 may be repeated for multiple, different separation distances 124 between the pre-polarizing magnet 116 and the EFNMR detector 118. For example, the pre-polarizing magnet 116 may be positioned at a first, particular separation distance 124 (for example, about 45 cm). A first set of FID values of the polarized gas phase may be measured with the EFNMR detector at the first, particular separation distance 124. Then, the pre-polarizing magnet 116 may be positioned at a second, particular separation distance 124 (for example, about 150 cm). A second set of FID values of the polarized gas phase may be measured with the EFNMR detector at the second, particular separation distance 124.

Method 1200 may continue at step 1214, which includes transforming the measured FID values from a non-adiabatic transition from an Earth's field to a polarizing field to an effective adiabatic transition from the Earth's field to the polarizing field. For example, in some aspects, the transformation of the measured FID values from a non-adiabatic transition from an Earth's field to a polarizing field to an effective adiabatic transition from the Earth's field to the polarizing field includes determining a location of a particular portion of the dual polarized oil-water fluid 128 relative to a detection zone of the EFNMR detector 118. In some aspects, that determination based on a start time of the additional polarization (for example, $t_{polz}$) of the polarized mixed oil-water fluid 128. As previously described, for example, the portion of the oil-water fluid 128 may be an initial portion, an intermediate portion, or an outside portion. At the start time of the additional polarization, for instance, the initial portion may be fully inside the detection region of the EFNMR detector 118, while the intermediate and outside portions are fully outside such region. As the oil-water fluid 128 circulated to and through the EFNMR detector 118, at a time greater than a ratio of a combined length of the separation distance 124 and a length of a region just outside of the detection region (for example, $L_j$) to a velocity of the oil-water fluid 128, the outside portion may be fully within the detection region. This outside portion, in some aspects, may be independent of the non-adiabatic transition from the Earth's field to the polarizing field. Thus, the portion of FID values that correspond to the outside portion of the polarized oil-water fluid 128 may be selected to transform the measured FID values from a non-adiabatic transition from an Earth's field to a polarizing field to an effective adiabatic transition from the Earth's field to the polarizing field.

Method 1200 may continue at step 1216, which includes determining a velocity of the oil in the mixed oil-water liquid flow and a velocity of the water in the mixed oil-water liquid flow based on differences in NMR signal relaxation properties of the transformed FID values. For example, once the transformed FID values are determined in step 1214, the velocities of the oil 104 and the water 108 may be determined according to the $T_2$ properties of the transformed FID values. In some aspects, this determination includes applying a pseudo-1D inversion to the transformed FID values. The pseudo 1D-inversion, in some aspects, may be a Tikhonov inversion. Then, a 2D probability distribution (P) of the velocity of the oil 104 in the oil-water fluid 128 and the velocity of the water 108 in the oil-water fluid 128 is determined based on the applied 1D inversion of the transformed FID values and a model kernel matrix (M) (as described in Eq. (16)). The model kernel matrix may be a function of a polarization pulse time of the electromagnet, a distance 124 between the pre-polarizing magnet 116 and the EFNMR detector 118, a start time of a radio-frequency signal acquisition from the radio-frequency coil 120, and the NMR signal relaxation properties ($T_1$) of the transformed FID values, as previously described.

Method 1200 may continue at step 1218, which includes determining an oil content and a water content of the mixed oil-water liquid flow from the transformed plurality of FID values based on differences in NMR signal relaxation properties of the transformed FID values. For example, the oil and water content can be determined according to, for example, the mean velocities (Eq. (23)) and, from these, the individual phase volumetric flowrates (Eq. (24)).

Figure 12B:
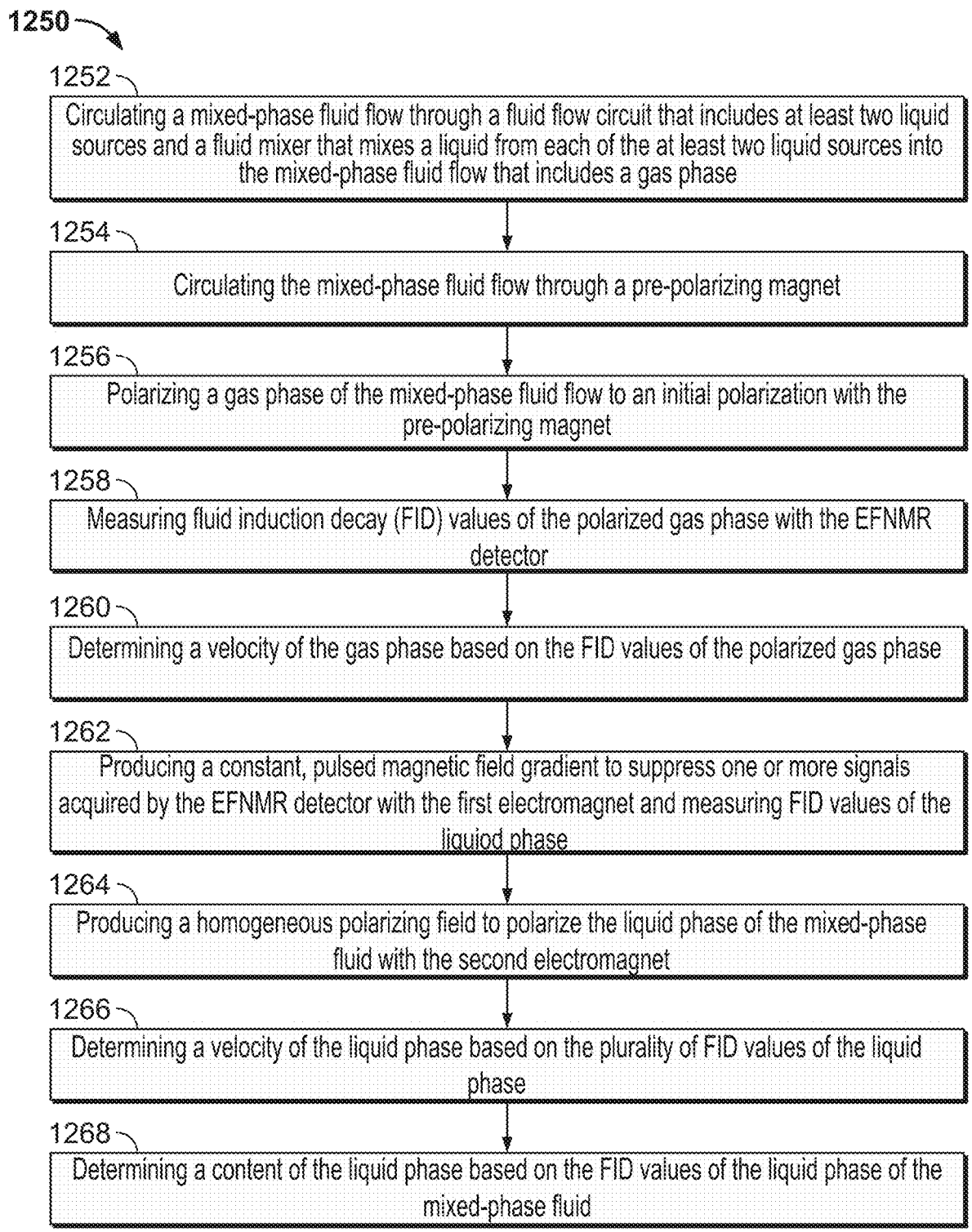

Turning now to FIG. 12B, this figure illustrates a flowchart that describes an example method 1250 for determining one or more fluid properties of a mixed-phase fluid. In some aspects, all or part of the example method 1250 can be implemented by or with the control system 122 and, more generally, the fluid measurement system 200 shown in FIG. 2. Method 1250 may begin at step 1252, which includes circulating a mixed-phase fluid flow through a fluid flow circuit that includes at least two liquid sources and a fluid mixer that mixes a liquid from each of the at least two liquid sources into the mixed-phase fluid flow. For example, a first liquid, such as the oil 104, and a second liquid, such as the water 108, may be mixed by the fluid mixer 114 and circulated (for example, by pumps 110 and 112) through the conduit 150. In some aspects, a gas phase 165 from gas source 163 is injected into the mixed liquid phase downstream of the fluid mixer 114. In some aspects, the gas phase may be a hydrocarbon gas.

Method 1250 may continue at step 1254, which includes circulating the mixed-phase fluid flow through a pre-polarizing magnet. For example, the mixed-phase fluid 128 is circulated through the pre-polarizing magnet 116 within the conduit 150.

Method 1250 may continue at step 1256, which includes polarizing a gas phase of the mixed-phase fluid flow to an initial polarization with the pre-polarizing magnet. For example, the pre-polarizing magnet 116 may be operated (for example, by the control system 122) to generate a homogeneous polarization field to polarize the mixed-phase fluid 128 (including a gas phase within the fluid 128) to an initial polarization.

Method 1250 may continue at step 1258, which includes measuring a plurality of fluid induction decay (FID) values of the polarized gas phase with the EFNMR detector. For example, once polarized to the initial polarization, the mixed-phase fluid 128 is circulated a particular distance 124 ($L_{PD}$) to the EFNMR detector 118, which includes the first electromagnet 161, the second electromagnet 160, and the radio-frequency coil 120. The polarized gas phase, flows through the EFNMR detector 118, in which the FID values of the gas phase are measured. In some aspects, the FID values include relaxation time constants ($T_1$ and $T_2$) associated with the gas phase, both of which quantify the rate of energy transfer in magnetic resonance processes. The spin-lattice relaxation rate ($T_1$) is a fluid property describing the rate of signal accumulation in a magnetic field, while the spin-spin relaxation rate ($T_2$) describes the rate of signal decay or dephasing of hydrogen atoms within a fluid. In some aspects, the FID values are a function of velocity and $T_1$ values.

In some aspects, step 1258 may be repeated for multiple, different separation distances 124 between the pre-polarizing magnet 116 and the EFNMR detector 118. For example, the pre-polarizing magnet 116 may be positioned at a first, particular separation distance 124 (for example, about 45 cm). A first set of FID values of the polarized gas phase may be measured with the EFNMR detector at the first, particular separation distance 124. Then, the pre-polarizing magnet 116 may be positioned at a second, particular separation distance 124 (for example, about 150 cm). A second set of FID values of the polarized gas phase may be measured with the EFNMR detector at the second, particular separation distance 124.

Method 1250 may continue at step 1260, which includes determining a velocity of the gas phase based on the FID values of the polarized gas phase. For example, in some aspects, determining the velocity of the gas phase includes applying a pseudo-1D inversion, such as a Tikhonov inversion, to the measured FID values of the gas phase. In some aspects, for example, such a pseudo-1D inversion includes applying a discretized probability distribution vector of a variable (p) may be expressed as a function of the measured FID values (in other words, NMR signal (s)) via a model kernel matrix (M) as described in Eq. 1 and subsequent equations according to the present disclosure. By step 1260 (or step 1258), the initial polarization of the liquid phase of the mixed-phase fluid 128 may be decayed by the time the mixed-phase fluid 128 has reached the radio-frequency coil 120 of the EFNMR detector 118; thus, the FID measurements taken in step 1258 are only of the gas phase of the mixed-phase fluid 128.

Method 1250 may continue at step 1262, which includes producing a pulsed magnetic field gradient with the first electromagnet to suppress one or more signals acquired by the EFNMR detector with the first electromagnet and measuring FID values of the liquid phase of the mixed-phase fluid. For example, the first electromagnet 161 may produce a pulsed magnetic field gradient to suppress the NMR signals taken from the gas phase of the mixed-phase fluid 128. Simultaneously, FID measurements may be taken of the liquid phase of the mixed-phase fluid 128 with the NMR detector 118 while the second electromagnet 160 is producing a reasonably homogeneous magnetic field to polarize the liquid phase during step 1262.

In some aspects, step 1262 may be repeated for multiple, different pulse time durations of the second electromagnet 160. For example, the second electromagnet 160 may be operated at a first, particular pulse time duration ($t_{polz}$). A first set of FID values of the polarized liquid phase may be measured with the EFNMR detector at the first, particular pulse time duration. Then, the second electromagnet 160 may be operated at a second, particular pulse time duration. A second set of FID values of the polarized liquid phase may be measured with the EFNMR detector at the second, particular pulse time duration.

Method 1250 may continue at step 1264, which includes producing a homogeneous polarizing field to polarize the liquid phase of the mixed-phase fluid with the second electromagnet. For example, as the first electromagnet 161 suppresses one or more signals from the gas phase and measuring FID values of the liquid phase of the mixed-phase fluid, the second electromagnet 160 produces the homogenous magnetic field to polarize the liquid phase of the mixed-phase fluid 128.

Method 1250 may continue at step 1266, which includes determining a velocity of the liquid phase based on the FID values of the polarized liquid phase. For example, as with the gas phase, the velocity of the liquid phase may be determined by applying a pseudo-1D inversion, such as a Tikhonov inversion, to the measured FID values of the liquid phase. In some aspects, for example, such a pseudo-1D inversion includes applying a discretized probability distribution vector of a variable (p) may be expressed as a function of the measured FID values (in other words, NMR signal (s)) via a model kernel matrix (M) as described in Eq. 1 and subsequent equations according to the present disclosure.

Method 1250 may continue at step 1268, which includes determining a content of the liquid phase based on the FID values of the liquid phase of the mixed-phase fluid. For example, in the case of the liquid phase being a mixture or combination of oil and water, an oil-water content of the liquid phase of the mixed-phase fluid 128 is determined with a 2D probability distribution of the velocity of the liquid phase in the mixed-phase fluid 128 based on the applied 1D inversion of the FID values of the liquid phase and a model kernel matrix, as described according to step 1218 of method 1200.

Figure 13:
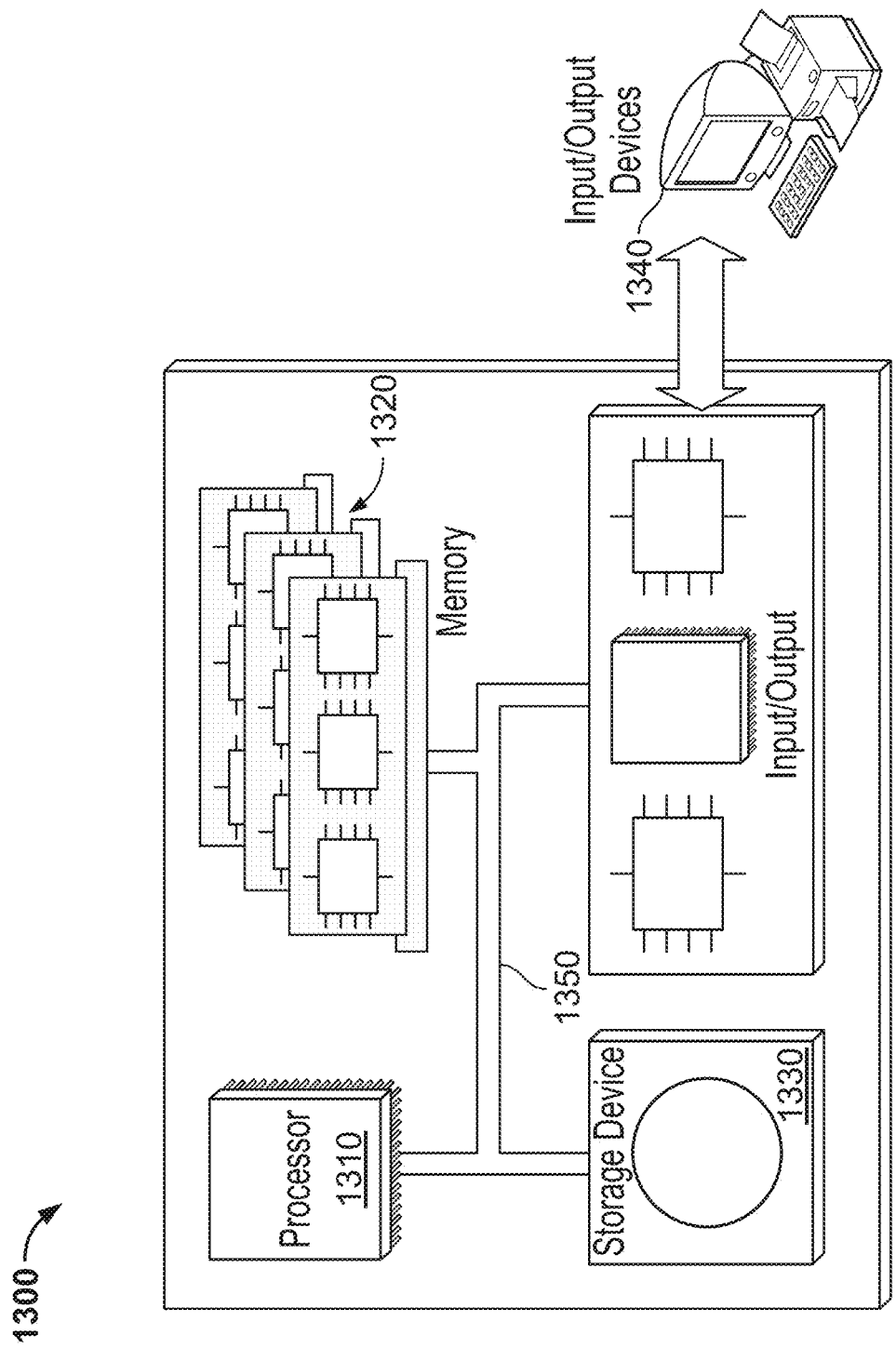
FIG. 13 is a schematic illustration of an example controller (or control system) for controlling operations of a fluid measurement system according to the present disclosure.

FIG. 13 is a schematic illustration of an example controller 1300 (or control system) for controlling operations of a fluid measurement system according to the present disclosure. For example, the controller 1300 may include or be part of the control system 122 shown in FIGS. 1 and 2. The controller 1300 is intended to include various forms of digital computers, such as printed circuit boards (PCB), processors, digital circuitry, or otherwise parts of a fluid measurement system. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 1300 includes a processor 1310, a memory 1320, a storage device 1330, and an input/output device 1340. Each of the components 1310, 1320, 1330, and 1340 are interconnected using a system bus 1350. The processor 1310 is capable of processing instructions for execution within the controller 1300. The processor may be designed using any of a number of architectures. For example, the processor 1310 may be a CISC (Complex Instruction Set Computers) processor, a RISC (Reduced Instruction Set Computer) processor, or a MISC (Minimal Instruction Set Computer) processor.

In one implementation, the processor 1310 is a single-threaded processor. In another implementation, the processor 1310 is a multi-threaded processor. The processor 1310 is capable of processing instructions stored in the memory 1320 or on the storage device 1330 to display graphical information for a user interface on the input/output device 1340.

The memory 1320 stores information within the controller 1300. In one implementation, the memory 1320 is a computer-readable medium. In one implementation, the memory 1320 is a volatile memory unit. In another implementation, the memory 1320 is a non-volatile memory unit.

The storage device 1330 is capable of providing mass storage for the controller 1300. In one implementation, the storage device 1330 is a computer-readable medium. In various different implementations, the storage device 1330 may be a floppy disk device, a hard disk device, an optical disk device, or a tape device.

The input/output device 1340 provides input/output operations for the controller 1300. In one implementation, the input/output device 1340 includes a keyboard and/or pointing device. In another implementation, the input/output device 1340 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A fluid measurement system, comprising:
 a fluid flow circuit that comprises at least two liquid sources, a gas source, and a fluid mixer that mixes at least two liquids from the at least two liquid sources to form a liquid phase of a mixed-phase fluid that also includes a gas phase from the gas source;
 a pre-polarizing magnet positioned to receive the mixed-phase fluid flow from the fluid mixer;
 an Earth's field nuclear magnetic resonance (EFNMR) detector that comprises a radio-frequency (RF) coil, a first electromagnet aligned with the RF coil, and a second electromagnet downstream of and separate from the first electromagnet, the EFNMR detector positioned to receive the mixed-phase fluid from the pre-polarizing magnet; and
 a control system communicably coupled to the pre-polarizing magnet and the EFNMR detector and configured to perform operations comprising:
  controlling the pre-polarizing magnet to polarize at least the gas phase of the mixed-phase fluid flow to an initial polarization while the first and second electromagnets are unenergized;

controlling the EFNMR detector to measure a plurality of fluid induction decay (FID) values of the polarized gas phase;

determining a velocity of the gas phase based on the plurality of FID values of the polarized gas phase while the first and second electromagnets are unenergized;

energizing the first electromagnet to produce a pulsed magnetic field gradient to suppress one or more signals acquired by the EFNMR detector;

controlling the EFNMR detector simultaneously with the production of the pulsed magnetic field gradient to measure a plurality of FID values of the liquid phase of the mixed-phase fluid;

energizing the second electromagnet to generate a homogeneous polarizing field to polarize the liquid phase of the mixed-phase fluid;

determining a velocity of the liquid phase based on the plurality of FID values of the polarized liquid phase; and determining a content of the liquid phase based on the plurality of FID values of the mixed-phase fluid.

2. The fluid measurement system of claim 1, wherein the operation of determining a velocity of the gas phase based on the plurality of FID values of the polarized gas phase comprises applying a pseudo-1D inversion to the plurality of FID values of the gas phase.

3. The fluid measurement system of claim 2, wherein the operation of determining a velocity of the liquid phase based on the plurality of FID values of the polarized liquid phase comprises applying another pseudo-1D inversion to the plurality of FID values of the liquid phase.

4. The fluid measurement system of claim 3, wherein the operation of determining a content of the liquid phase based on the plurality of FID values of the mixed-phase fluid comprises determining an oil-water content of the liquid phase with a 2D probability distribution of the velocity of the liquid phase in the mixed-phase fluid flow based on the applied another 1D inversion of the plurality of FID values of the liquid phase and a model kernel matrix.

5. The fluid measurement system of claim 3, wherein at least one of the pseudo-1D inversion or the another psuedo-1D inversion comprises a Tikhonov inversion.

6. The fluid measurement system of claim 1, wherein the gas source comprises a pressurized gas source fluidly coupled to the fluid flow circuit between the fluid mixer and the pre-polarizing permanent magnet.

7. The fluid measurement system of claim 1, wherein the at least two liquids comprise oil and water.

8. The fluid measurement system of claim 1, wherein the pre-polarizing magnet is positionable at a plurality of distances apart from the EFNMR detector.

9. The fluid measurement system of claim 8, wherein the operation of controlling the EFNMR detector to measure the plurality of FID values of the polarized gas phase comprises:

controlling the EFNMR detector to measure a first plurality of FID values of the polarized gas phase at a first distance of the plurality of distances; and controlling the EFNMR detector to measure a second plurality of FID values of the polarized gas phase at a second distance of the plurality of distances.

10. The fluid measurement system of claim 1, wherein the operation of controlling the EFNMR detector to measure the plurality of FID values of the polarized liquid phase comprises:

controlling the EFNMR detector to measure a first plurality of FID values of the polarized liquid phase at a first pulse time duration of a plurality of electromagnet pulse time durations; and controlling the EFNMR detector to measure a second plurality of FID values of the polarized liquid phase at a second pulse time duration of the plurality of electromagnet pulse time durations.

11. The fluid measurement system of claim 1, wherein the plurality of FID values of the polarized gas phase comprise velocity values, and the plurality of FID values of the polarized liquid phase comprise velocity values and $T_1$ values of the liquid phase.

12. A method for measuring fluid properties, comprising:

circulating a mixed-phase fluid flow through a fluid flow circuit that comprises a gas source, at least two liquid sources, and a fluid mixer that mixes a liquid from each of the at least two liquid sources to form a liquid phase of the mixed-phase fluid flow that includes a gas phase;

circulating the mixed-phase fluid flow through a pre-polarizing magnet;

polarizing at least the gas phase of the mixed-phase fluid flow to an initial polarization with the pre-polarizing magnet;

measuring a plurality of fluid induction decay (FID) values of the polarized gas phase with an Earth's field nuclear magnetic resonance (EFNMR) detector that comprises a radio-frequency (RF) coil, a first electromagnet aligned with the RF coil, and a second electromagnet positioned downstream of and separate from the first electromagnet;

determining a velocity of the gas phase based on the plurality of FID values of the polarized gas phase while the first and second electromagnets are unenergized;

producing a pulsed magnetic field gradient to suppress one or more signals acquired by the EFNMR detector with the first electromagnet;

measuring a plurality of FID values of the liquid phase of the mixed-phase fluid with the EFNMR detector simultaneously with the production of the pulsed magnetic field gradient;

producing a homogeneous polarizing field to polarize the liquid phase of the mixed-phase fluid with the second electromagnet;

determining a velocity of the liquid phase based on the plurality of FID values of the polarized liquid phase; and determining a content of the liquid phase based on the plurality of FID values of the liquid phase of the mixed-phase fluid.

13. The method of claim 12, wherein determining a velocity of the gas phase based on the plurality of FID values of the polarized gas phase comprises applying a pseudo-1D inversion to the plurality of FID values of the gas phase.

14. The method of claim 13, wherein determining a velocity of the liquid phase based on the plurality of FID values of the liquid phase comprises applying another pseudo-1D inversion to the plurality of FID values of the liquid phase.

15. The method of claim 14, wherein determining a content of the liquid phase based on the plurality of FID values of the mixed-phase fluid comprises determining an oil-water content of the liquid phase with a 2D probability distribution of the velocity of the liquid phase in the mixed-phase fluid flow based on the applied another 1D inversion of the plurality of FID values of the liquid phase and a model kernel matrix.

16. The method of claim 14, wherein at least one of the pseudo-1D inversion or the another psuedo-1D inversion comprises a Tikhonov inversion.

17. The method of claim 12, further comprising:
separating the liquid phase into a first liquid flow and a second liquid flow with a liquid separator fluidly coupled to a first liquid source and a second liquid source; and
injecting the gas phase into the liquid phase from a pressurized gas source that is fluidly coupled in the fluid flow circuit between the fluid mixer and the pre-polarizing permanent magnet.

18. The method of claim 17, wherein the first liquid comprises oil and the second liquid comprises water.

19. The method of claim 12, further comprising:
positioning the pre-polarizing magnet at a plurality of distances apart from the EFNMR detector.

20. The method of claim 19, wherein measuring the plurality of FID values of the polarized gas phase with the EFNMR detector comprises:
measuring a first plurality of FID values of the polarized gas phase with the EFNMR detector at a first distance of the plurality of distances; and
measuring a second plurality of FID values of the polarized gas phase with the EFNMR detector at a second distance of the plurality of distances.

21. The method of claim 12, wherein measuring the plurality of FID values of the polarized liquid phase with the EFNMR detector comprises:
measuring a first plurality of FID values of the liquid phase with the EFNMR detector at a first pulse time duration of a plurality of pulse time durations of the second electromagnet; and
measuring a second plurality of FID values of the liquid phase with the EFNMR detector at a second pulse time duration of a plurality of pulse time durations of the second electromagnet.

22. The method of claim 12, wherein the plurality of FID values of the polarized gas phase comprise velocity values, and the plurality of FID values of the liquid phase comprise velocity values and $T_1$ values of the liquid phase.

* * * * *